(12) United States Patent
Zhang

(10) Patent No.: US 12,400,722 B1
(45) Date of Patent: Aug. 26, 2025

(54) SHIFT REGISTER, GATE DRIVING CIRCUIT AND DRIVING METHOD THEREOF, AND DISPLAY PANEL

(71) Applicants: Wuhan Tianma Micro-Electronics Co., Ltd., Wuhan (CN); Wuhan Tianma Micro-Electronics Co., Ltd. Shanghai Branch, Shanghai (CN)

(72) Inventor: Mengmeng Zhang, Wuhan (CN)

(73) Assignees: Wuhan Tianma Micro-Electronics Co., Ltd., Wuhan (CN); Wuhan Tianma Micro-Electronics Co., Ltd. Shanghai Branch, Shanghai (CN)

( * ) Notice: Subject to any disclaimer, the term of this patent is extended or adjusted under 35 U.S.C. 154(b) by 0 days.

(21) Appl. No.: 18/797,890

(22) Filed: Aug. 8, 2024

(30) Foreign Application Priority Data

Feb. 27, 2024 (CN) .......................... 202410217029.9

(51) Int. Cl.
  *G09G 3/20* (2006.01)
  *G11C 19/28* (2006.01)

(52) U.S. Cl.
  CPC .............. *G11C 19/28* (2013.01); *G09G 3/20* (2013.01); *G09G 2310/0267* (2013.01); *G09G 2310/0286* (2013.01); *G09G 2330/021* (2013.01)

(58) Field of Classification Search
  CPC .. G11C 19/28; G09G 3/20; G09G 2310/0267; G09G 2310/0286; G09G 2330/021
  See application file for complete search history.

(56) References Cited

U.S. PATENT DOCUMENTS

| | | | | |
|---|---|---|---|---|
| 2020/0333666 A1* | 10/2020 | Hohjoh | ............. | G02F 1/133611 |
| 2020/0333949 A1* | 10/2020 | Lim | ..................... | G06F 3/04883 |
| 2020/0335023 A1* | 10/2020 | Yen | ........................... | G09G 5/14 |
| 2020/0335024 A1* | 10/2020 | Kim | ......................... | G09G 3/20 |
| 2020/0335025 A1* | 10/2020 | Kim | ......................... | G09G 3/20 |

FOREIGN PATENT DOCUMENTS

CN 113643666 A 11/2021

* cited by examiner

*Primary Examiner* — Sejoon Ahn
(74) *Attorney, Agent, or Firm* — Anova Law Group, PLLC

(57) ABSTRACT

Shift register, gate driving circuit and driving method thereof, and display panel are provided. The shift register includes input module, control module and output module. A control terminal of the input module is configured to receive first clock signal. The control module includes first switch unit, second switch unit, and energy storage unit. A control terminal of the first switch unit is configured to receive first control signal. A control terminal of the second switch unit is configured to receive second control signal. A first terminal of the second switch unit is configured to receive second power signal. A second terminal of the energy storage unit is configured to receive second clock signal. Input terminals of the output module are respectively configured to receive the second clock signal, the first power signal and the second power signal. An output terminal of the output module is configured to output scanning signal.

20 Claims, 14 Drawing Sheets

SHIFT REGISTER, GATE DRIVING CIRCUIT AND DRIVING METHOD THEREOF, AND DISPLAY PANEL

CROSS-REFERENCE TO RELATED APPLICATION

The present disclosure claims priority of Chinese Patent Application No. 202410217029.9, filed on Feb. 27, 2024, the entire content of which is hereby incorporated by reference.

FIELD OF THE DISCLOSURE

The present disclosure generally relates to the field of display technology and, more particularly, relates to a shift register, a gate driving circuit and a driving method thereof, and a display panel.

BACKGROUND

With the development of display technology, while pursuing higher resolution of a display device, power consumption of the display device may increase accordingly. To reduce power consumption of display devices, some products may even perform driving frequencies below 0.1 Hz in standby modes.

In existing technology, when a display panel is in a low-frequency holding stage, the shift register circuit may still be in a normal operation condition. As such, the power consumption in a low-frequency display mode may be same as the power consumption in a high-frequency display mode. As a result, the display panel may still consume a large amount of power, and advantages of low power consumption in the low-frequency display mode may not be fully utilized.

SUMMARY

One aspect of the present disclosure includes a shift register. The shift register includes an input module. A control terminal of the input module is configured to receive a first clock signal, and a plurality of input terminals of the input module is configured to receive an input signal, the first clock signal, and a first power signal respectively. The shift register also includes a control module, including a first switch unit, a second switch unit, and an energy storage unit. A control terminal of the first switch unit is configured to receive a first control signal, a first terminal of the first switch unit is electrically connected to a first output terminal of the input module, a second terminal of the first switch unit is electrically connected to a first terminal of the energy storage unit and a second terminal of the second switch unit respectively, a control terminal of the second switch unit is configured to receive a second control signal, a first terminal of the second switch unit is configured to receive a second power signal, and a second terminal of the energy storage unit is configured to receive a second clock signal. The shift register also includes an output module. A plurality of control terminals of the output module is electrically connected to the first power signal, the first output terminal of the input module, a second output terminal of the input module, and a third terminal of the energy storage unit respectively, a plurality of input terminals of the output module is respectively configured to receive the second clock signal, the first power signal and the second power signal, and a output terminal of the output module is configured to output a scanning signal. In a first sub-stage of a holding stage, the first switch unit is configured to be turned off under control of the first control signal, and the second switch unit is configured to be turned on under control of the second control signal, to keep potential states of the first terminal of the energy storage unit and the third terminal of the energy storage unit consistent Another aspect of the present disclosure includes a gate driving circuit. The gate driving circuit includes a first clock signal line, a second clock signal line, a first control signal line, a second control signal line, and a plurality of cascaded shift registers. The plurality of cascaded shift registers includes a first stage shift register, an i-th stage shift register, and an (i+1)-th stage shift register, where i is a positive integer greater than 1. A shift register of the plurality of cascaded shift registers includes an input module, where a control terminal of the input module is configured to receive a first clock signal, and a plurality of input terminals of the input module is configured to receive an input signal, the first clock signal, and a first power signal respectively; a control module, including a first switch unit, a second switch unit, and an energy storage unit, where a control terminal of the first switch unit is configured to receive a first control signal, a first terminal of the first switch unit is electrically connected to a first output terminal of the input module, a second terminal of the first switch unit is electrically connected to a first terminal of the energy storage unit and a second terminal of the second switch unit respectively, a control terminal of the second switch unit is configured to receive a second control signal, a first terminal of the second switch unit is configured to receive a second power signal, and a second terminal of the energy storage unit is configured to receive a second clock signal; and an output module, where a plurality of control terminals of the output module is electrically connected to the first power signal, the first output terminal of the input module, a second output terminal of the input module, and a third terminal of the energy storage unit respectively, a plurality of input terminals of the output module is respectively configured to receive the second clock signal, the first power signal and the second power signal, and a output terminal of the output module is configured to output a scanning signal. An input terminal of the input module in the first-stage shift register is configured to receive a start signal, a control terminal of the first switch unit in each shift register is electrically connected to the first control signal line to receive the first control signal, a control terminal of the second switch unit in each shift register is electrically connected to the second control signal line to receive the second control signal. A control terminal of the input module in the i-th stage shift register and a first input terminal of the input module in the i-th stage shift register are respectively electrically connected to the first clock signal line to receive the first clock signal, a second terminal of the energy storage unit and a first input terminal of the output module in the i-th stage shift register are respectively electrically connected to the second clock signal line to receive the second clock signal. A control terminal of the input module in the (i+1)-th stage shift register and a first input terminal of the input module in the (i+1)-th stage shift register are respectively electrically connected to the second clock signal line to receive second clock signal, a second terminal of the energy storage unit in the i-th stage shift register and the first input terminal of the output module in the i-th stage shift register are respectively electrically connected to the first clock signal line to receive the first clock signal, and an input terminal of the input module in the (i+1)-th stage shift register is electrically connected to an output terminal of the output module in the i-th stage shift register.

Another aspect of the present disclosure includes a driving method for the gate driving circuit provided by the present disclosure. The driving method includes a data writing stage and a holding stage. In a first sub-stage of the holding stage, the first switch unit that controls the gate driving circuit is turned off, and the second switch unit that controls the gate driving circuit is turned on, such that potential states of the first terminal of the energy storage unit and the third terminal of the energy storage unit are kept consistent.

Another aspect of the present disclosure includes a display panel. The display panel includes a gate driving circuit. The gate driving circuit includes a first clock signal line, a second clock signal line, a first control signal line, a second control signal line, and a plurality of cascaded shift registers. The plurality of cascaded shift registers includes a first stage shift register, an i-th stage shift register, and an (i+1)-th stage shift register, where i is a positive integer greater than 1. A shift register of the plurality of cascaded shift registers includes an input module, where a control terminal of the input module is configured to receive a first clock signal, and a plurality of input terminals of the input module is configured to receive an input signal, the first clock signal, and a first power signal respectively; a control module, including a first switch unit, a second switch unit, and an energy storage unit, where a control terminal of the first switch unit is configured to receive a first control signal, a first terminal of the first switch unit is electrically connected to a first output terminal of the input module, a second terminal of the first switch unit is electrically connected to a first terminal of the energy storage unit and a second terminal of the second switch unit respectively, a control terminal of the second switch unit is configured to receive a second control signal, a first terminal of the second switch unit is configured to receive a second power signal, and a second terminal of the energy storage unit is configured to receive a second clock signal; and an output module, where a plurality of control terminals of the output module is electrically connected to the first power signal, the first output terminal of the input module, a second output terminal of the input module, and a third terminal of the energy storage unit respectively, a plurality of input terminals of the output module is respectively configured to receive the second clock signal, the first power signal and the second power signal, and a output terminal of the output module is configured to output a scanning signal. An input terminal of the input module in the first-stage shift register is configured to receive a start signal, a control terminal of the first switch unit in each shift register is electrically connected to the first control signal line to receive the first control signal, a control terminal of the second switch unit in each shift register is electrically connected to the second control signal line to receive the second control signal. A control terminal of the input module in the i-th stage shift register and a first input terminal of the input module in the i-th stage shift register are respectively electrically connected to the first clock signal line to receive the first clock signal, a second terminal of the energy storage unit and a first input terminal of the output module in the i-th stage shift register are respectively electrically connected to the second clock signal line to receive the second clock signal. A control terminal of the input module in the (i+1)-th stage shift register and a first input terminal of the input module in the (i+1)-th stage shift register are respectively electrically connected to the second clock signal line to receive second clock signal, a second terminal of the energy storage unit in the i-th stage shift register and the first input terminal of the output module in the i-th stage shift register are respectively electrically connected to the first clock signal line to receive the first clock signal, and an input terminal of the input module in the (i+1)-th stage shift register is electrically connected to an output terminal of the output module in the i-th stage shift register.

Other aspects of the present disclosure may be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
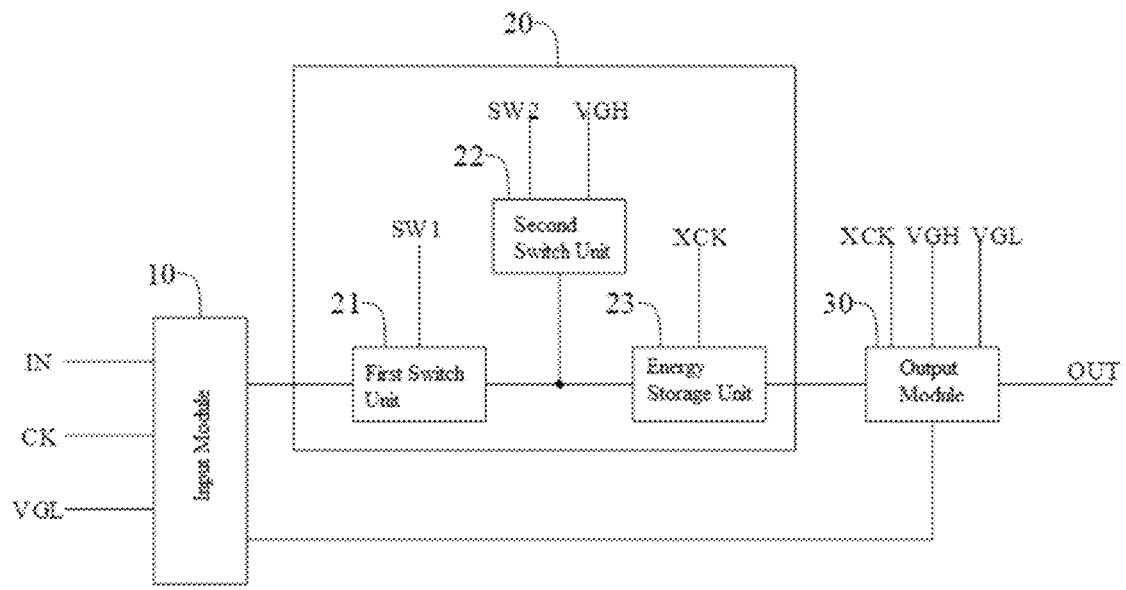
FIG. 1 illustrates a first schematic structural diagram of a shift register consistent with the disclosed embodiments of the present disclosure.

To make the objectives, technical solutions and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

Technologies, methods, and equipment known to those of ordinary skill in relevant fields may not be discussed in detail, but where appropriate, these technologies, methods, and equipment should be regarded as part of the present disclosure.

Unless otherwise defined, technical and scientific terms used herein have same meanings commonly understood by those of ordinary skills in related fields. It should be noted that technical and scientific terms used herein are only for describing specific embodiments and are not intended to limit the present disclosure.

In the present disclosure, terms "first", "second", etc. may be used to describe various elements, but these elements are not limited by these terms. These terms may only distinguish one element from another element. For example, without departing from the scope of the present disclosure, a first resistor may be referred to as a second resistor, and similarly, a second resistor may be referred to as a first resistor. The first resistor and the second resistor each are resistors, but may not be same resistors.

In the present disclosure, term "connection" may be understood as "electrical connection", "communication connection", etc., when electrical signals or data are transmitted between connected circuits, modules, units, etc.

It may be understood that term "at least one" refers to one or more, and term "plurality" refers to two or more. Term "at least part of elements" means part or each of the elements.

In the present disclosure, singular forms "a," "an," and "the" may include plurality as well, unless the context clearly dictates otherwise. In addition, terms "comprising" or "having" and the like designate the presence of stated features, integers, steps, operations, components, portions, or combinations thereof. Also, term "and/or" may include any and each combination of associated listed items.

As mentioned in Background, a shift register may be equipped with active devices or passive devices such as transistors and capacitors. During operation of a shift register, the clock signal provided to the shift register may repeatedly charge and discharge the devices in the shift register. Especially when the display panel is in a low-frequency holding stage, during the period when the signal output terminal of the shift register outputs a fixed potential for a long time, the clock signal may continue repeatedly charging and discharging each device in the shift register. As such, power may be wasted, and low power consumption of the shift register may not be realized.

To address the above technical problems, the inventor found through research that, in the low-frequency holding stage, by controlling the potential of each terminal of the device in the shift register that is frequently charged and discharged due to the clock signal, to be consistent, frequent charging and discharging of the device may be avoided, and power consumption may thus be reduced. The inventor further provided a technical solution.

Specifically, the present disclosure provides a shift register, including: an input module 10, a control module 20 and an output module 30. The control terminal of the input module 10 is configured to receive the first clock signal CK. A plurality of input terminals of the input module 10 is configured to receive the input signal IN, the first clock signal CK and the first power signal VGL respectively. The control module 20 includes a first switch unit 21, a second switch unit 22 and an energy storage unit 23. The control terminal of the first switch unit 21 is configured to receive the first control signal SW1. The first terminal of the first switch unit 21 is electrically connected to the first output terminal of the input module 10. The second terminal of the first switch unit 21 is electrically connected to the first terminal of the energy storage unit 23 and the second terminal of the second switch unit 22 respectively. The control terminal of the second switch unit 22 is configured to receive the second control signal SW2. The first terminal of the second switch unit 22 is configured to receive the second power signal VGH. The second terminal of the energy storage unit 23 is configured to receive the second clock signal XCK. A plurality of control terminals of the output module 30 is electrically connected to the first power signal VGL, the first output terminal of the input module 10, the second output terminal of the input module 10, and the third terminal of the energy storage unit, respectively. A plurality of input terminals of the output module 30 is respectively used to receive the second clock signal XCK, the first power signal VGL and the second power signal VGH. The output terminal of the output module 30 is configured to output the scanning signal OUT. In the first sub-stage of the holding stage, the first switch unit 21 is configured to be turned off under the control of the first control signal SW1, and the second switch unit 22 is configured to be turned on under the control of the second control signal SW2. As such, the potential states of the first terminal of the energy storage unit 23 and the third terminal of the energy storage unit 23 may be kept consistent.

With the above technical solution, in the first sub-stage of the holding stage, the first switch unit 21 and the second switch unit 22 may control the potential states of the first terminal and the third terminal of the energy storage unit 23 to remain consistent. Accordingly, frequent charging and discharging of the energy storage unit 23 in the first sub-stage may be avoided, and power consumption may thus be reduced.

The present disclosure provides a shift register. FIG. 1 illustrates a first schematic structural diagram of a shift register consistent with the disclosed embodiments of the present disclosure. Referring to FIG. 1, the shift register includes an input module 10, a control module 20 and an output module 30. The control terminal of the input module 10 is configured to receive the first clock signal CK. A plurality of input terminals of the input module 10 is configured to receive the input signal IN, the first clock signal CK and the first power signal VGL respectively. The control module 20 includes a first switch unit 21, a second switch unit 22 and an energy storage unit 23. The control terminal of the first switch unit 21 is configured to receive the first control signal SW1. The first terminal of the first switch unit 21 is electrically connected to the first output terminal of the input module 10. The second terminal of the first switch unit 21 is electrically connected to the first terminal of the energy storage unit 23 and the second terminal of the second switch unit 22 respectively. The control terminal of the second switch unit 22 is configured to receive the second control signal SW2. The first terminal of the second switch unit 22 is configured to receive the second power signal VGH. The second terminal of the energy storage unit 23 is configured to receive the second clock signal XCK. A plurality of control terminals of the output module 30 is electrically connected to the first power signal VGL, the first output terminal of the input module 10, the second output terminal of the input module 10, and the third terminal of the energy storage unit, respectively. A plurality of input terminals of the output module 30 is respectively used to receive the second clock signal XCK, the first power signal VGL and the second power signal VGH. The output terminal of the output module 30 is configured to output the scanning signal OUT.

Figure 2:
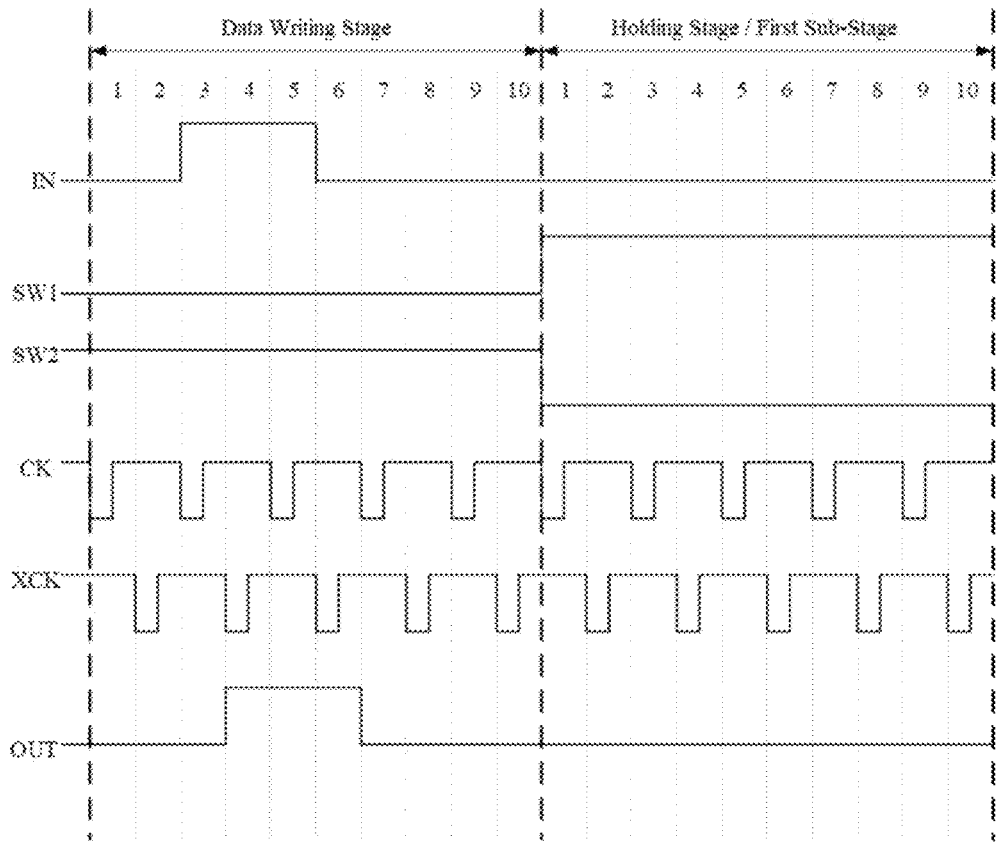
FIG. 2 illustrates a signal timing diagram of a shift register consistent with the disclosed embodiments of the present disclosure.

FIG. 2 illustrates a signal timing diagram of a shift register consistent with the disclosed embodiments of the present disclosure. Referring to FIG. 2, the shift register includes a data writing stage (active frame) and a holding stage (keep frame). The holding stage includes a first sub-stage. In the first sub-stage of the holding stage, the first switch unit 21 is configured to be turned off under the control of the first control signal SW1, and the second switch unit 22 is configured to be turned on under the control of the second control signal SW2 to keep the potential states of the first terminal of the energy storage unit 23 and the third terminal of the energy storage unit 23 consistent. The holding stage may only include the first sub-stage, or may also include other sub-stages. The present disclosure does not limit whether the holding stage includes other sub-stages. Accordingly, in the first sub-stage, the first switch unit 21 is in an off state and the second switch unit 22 is in an on state. That is, the first switch unit 21 cuts off the path between the input module 10 and the first terminal of the energy storage unit 23, and the second switch unit 22 conducts the path between the second power signal VGH and the first terminal of the energy storage unit 23. As a result, the potential of the first terminal of the energy storage unit 23 may not be affected by the first clock signal CK, and the potential states of the first terminal of the energy storage unit 23 and the third terminal of the energy storage unit 23 may remain consistent. As such, the energy storage unit 23 may not charge or discharge, and power consumption may be reduced. For example, the base frame of a display panel including a shift register is 60 Hz. When the data writing stage is 1 Hz and the first sub-stage is 59 Hz, the energy storage unit 23 may not charge or discharge during the 59 Hz period. Compared with the frequent charging and discharging within 59 Hz in existing technology, the present disclosure may reduce the power consumption of the display panel.

Figure 3:
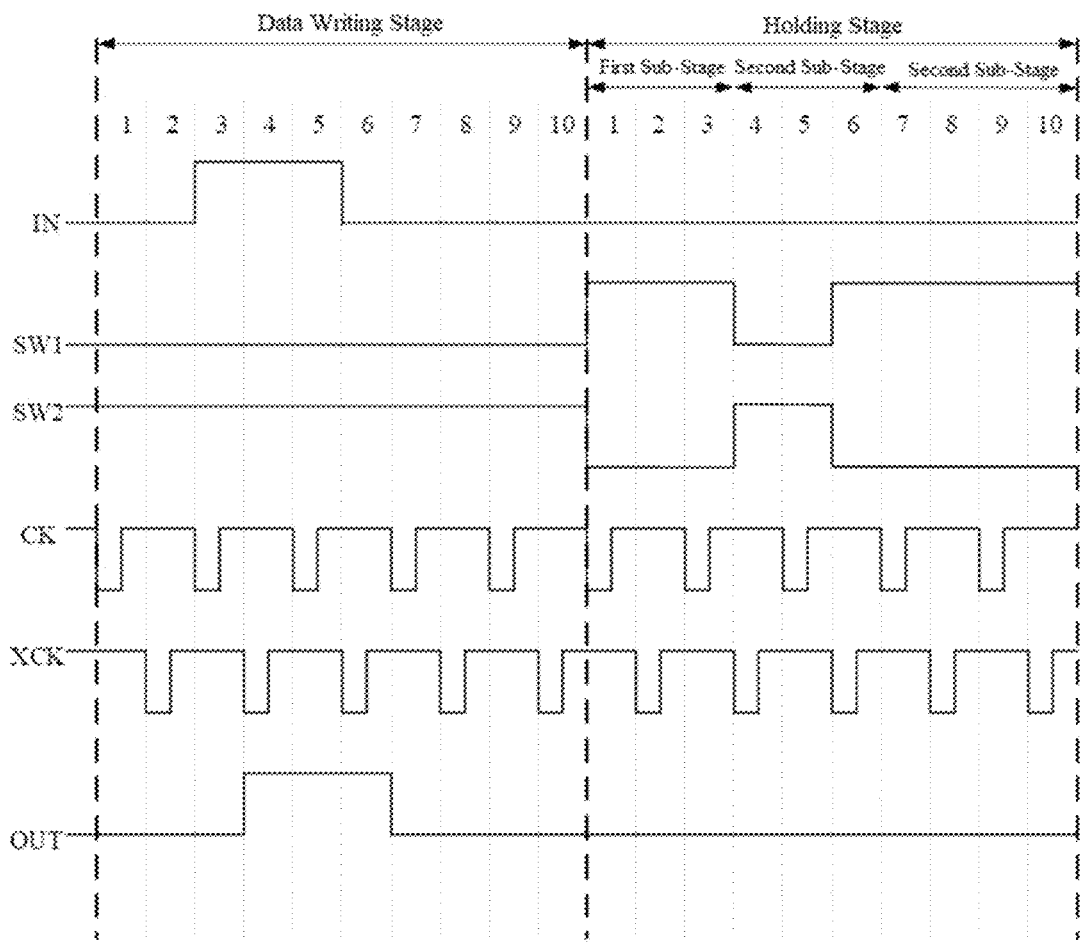
FIG. 3 illustrates a signal timing diagram of another shift register consistent with the disclosed embodiments of the present disclosure.

FIG. 3 illustrates a signal timing diagram of another shift register consistent with the disclosed embodiments of the present disclosure. As shown in FIG. 3, the holding stage includes a first sub-stage and at least one second sub-stage. In the second sub-stage of the holding stage, the first switch unit 21 is configured to be turned on under the control of the first control signal SW1, and the second switch unit 22 is configured to be turned off under the control of the second control signal SW2. As a result, the energy storage unit 23 may be charged and discharged according to the control signal output by the first output terminal of the input module 10 and the second power signal VGH under the control of the second clock signal XCK. Based on this, in the second sub-stage, the first switch unit 21 may be in an on state and the second switch unit 22 may be in an off state. That is, the first switch unit 21 may conduct the path between the input module 10 and the first terminal of the energy storage unit 23, and the second switch unit 22 may cut off the path between the second power signal VGH and the first terminal of the energy storage unit 23. In this case, the shift register may be restored to the state of the data writing stage, such that preparation for the next data writing may be made in advance. Accordingly, the display effect of the display panel including the shift register may be improved.

Still referring to FIG. 3, the duration of the second sub-stage may be greater than or equal to the period in which the first clock signal CK has an active potential. Based on this, the potential of the first terminal of the energy storage unit 23 may return to the state of the data writing stage in the second sub-stage. As such, the shift register may be restored to the state of the data writing stage, and smooth transition to the next display may be achieved through the second sub-stage. Accordingly, the display performance of the display panel including the shift register may be improved.

Still referring to FIG. 3, the first sub-stage precedes the second sub-stage. It may be understood that in the holding stage, the potentials of the first terminal and the third terminal of the energy storage unit 23 may remain consistent in the first sub-stage. As such, the energy storage unit 23 may be controlled not to charge or discharge in the first sub-stage. Then in the second sub-stage, by switching the on-off states of the first switch unit 21 and the second switch unit 22, the potential of the first terminal of the energy storage unit 23 may be restored to the data writing stage state. As such, the shift register may be controlled to return to the data writing state and prepare the transition for the next display. Accordingly, power consumption may be reduced, and display effect may be improved.

Still referring to FIGS. 2 and 3, in the data writing stage, the first switch unit 21 is configured to be turned on under the control of the first control signal SW1, and the second switch unit 22 is configured to be turned off under the control of the second control signal SW2. As such, under the control of the second clock signal XCK, the energy storage unit 23 may be charged and discharged according to the control signal output by the first output terminal of the input module 10 and the second power signal VGH. Based on this, under the actions of the input module 10 and the control module 20, the output module 30 may output the scanning signal OUT according to the second clock signal XCK, the first power signal VGL and the second power signal VGH, providing support for the display function of the display panel.

Figure 4:
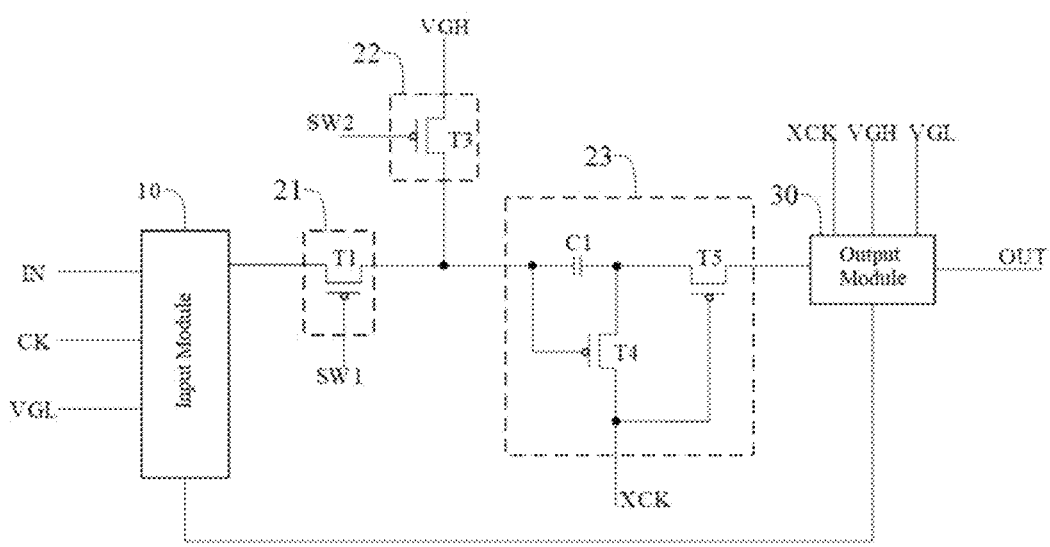
FIG. 4 illustrates a second schematic structural diagram of a shift register consistent with the disclosed embodiments of the present disclosure.
Figure 5:
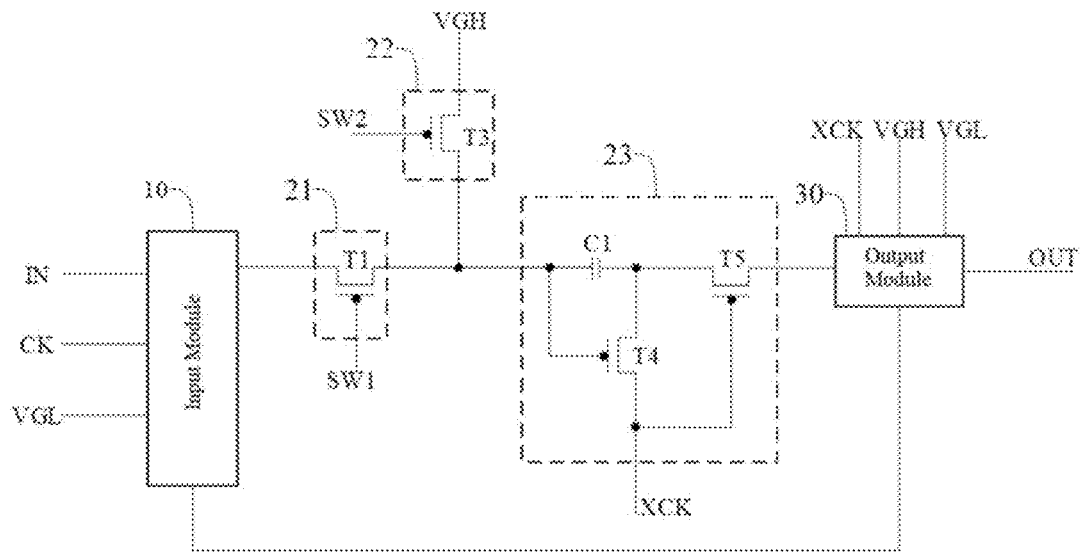
FIG. 5 illustrates a third schematic structural diagram of a shift register consistent with the disclosed embodiments of the present disclosure.

FIG. 4 illustrates a second schematic structural diagram of a shift register consistent with the disclosed embodiments of the present disclosure. FIG. 5 illustrates a third schematic structural diagram of a shift register consistent with the disclosed embodiments of the present disclosure. As shown in FIGS. 4 and 5, the first switch unit 21 includes a first transistor T1. The control terminal of the first transistor T1 is configured to receive the first control signal SW1. The first terminal of the first transistor T1 is connected to the first output terminal of the input module 10. The second terminal of the first transistor T1 is electrically connected to the first terminal of the energy storage unit 23 and the second terminal of the second switch unit 22 respectively. In the first sub-stage of the holding stage, the first transistor T1 is configured to be turned off under the control of the first control signal SW1. Based on this, the path between the input module 10 and the first terminal of the energy storage unit 23 may be cut off by the first transistor T1. As such, the potential of the first terminal of the energy storage unit 23 may not be affected by the input module 10. Accordingly, the potential of the first terminal of the energy storage unit 23 may not be changed by the change of the first clock signal CK in the first sub-stage. As a result, the potentials of the first terminal and the third terminal of the energy storage unit 23 may be kept consistent. Accordingly, the energy storage unit 23 may not be charged or discharged in the first sub-stage, and large power consumption due to the charging and discharging of the energy storage unit 23 may be avoided.

Figure 6:
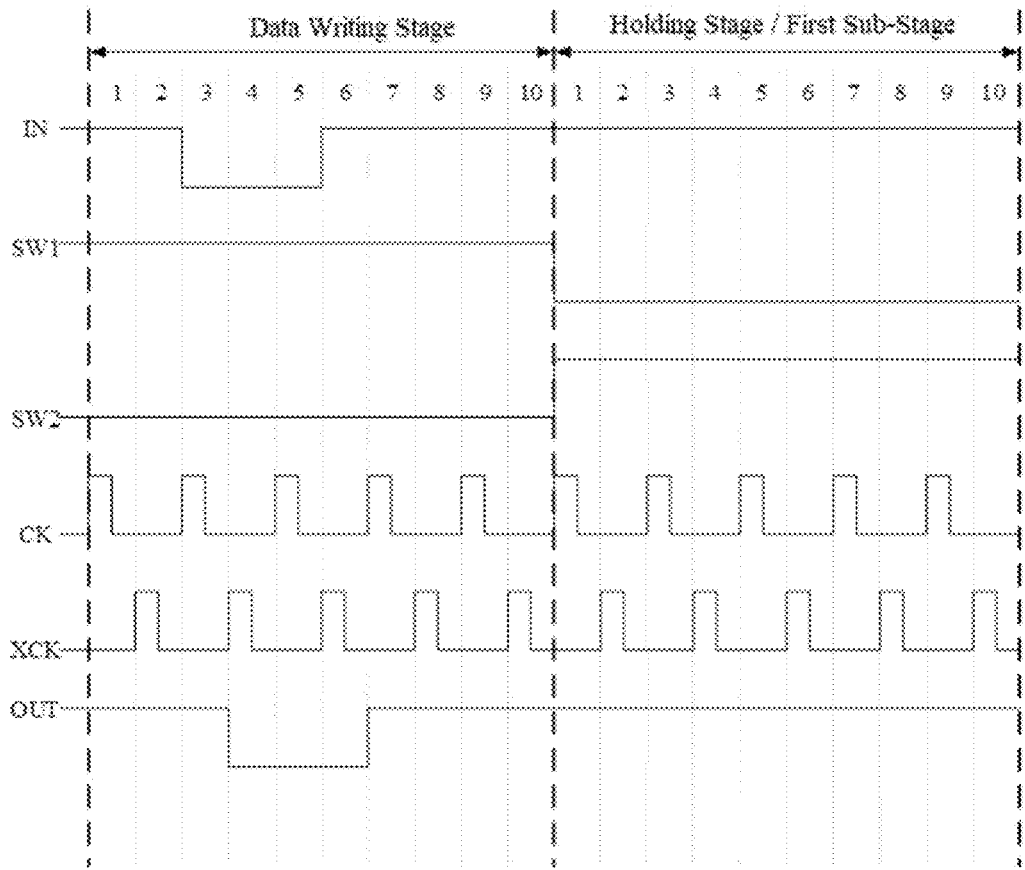
FIG. 6 illustrates a signal timing diagram of another shift register consistent with the disclosed embodiments of the present disclosure.

Still referring to FIGS. 4 and 5, the first transistor T1 may be a P-type transistor or an N-type transistor. For example, the first transistor T1 may be a P-type field effect transistor (FET), a P-type metal oxide semiconductor field effect transistor (MOSFET/MOS), N-FET or N-MOS. As an example, in FIG. 4, the first transistor T1 is a P-type transistor. Referring to the signal timing diagrams shown in FIGS. 2 and 3, when the first control signal SW1 is in a low potential state, the first transistor T1 is in a conductive state, and when the first control signal SW1 is in a high potential state, the first transistor T1 is in an off state. As an example, in FIG. 5, the first transistor T1 is an N-type transistor. FIG. 6 illustrates a signal timing diagram of another shift register consistent with the disclosed embodiments of the present disclosure. Referring to the signal timing diagram shown in FIG. 6, for the shift register shown in FIG. 5, when the first control signal SW1 is in a high potential state, the first transistor T1 is in an off state, and when the first control signal SW1 is in a low potential state, the first transistor T1 is in a conductive state.

In one embodiment, when the shift register includes P-type transistors, the first terminal of each transistor is the source, and the second terminal of each transistor is the drain. When the shift register includes N-type transistors, the first terminal of each transistor is the drain, and the second terminal of each transistor is the source. The difference between using N-type transistors and using P-type transistors is that the signal potential states are opposite, while the control principles of using N-type transistors and using P-type transistors are same.

Figure 7:
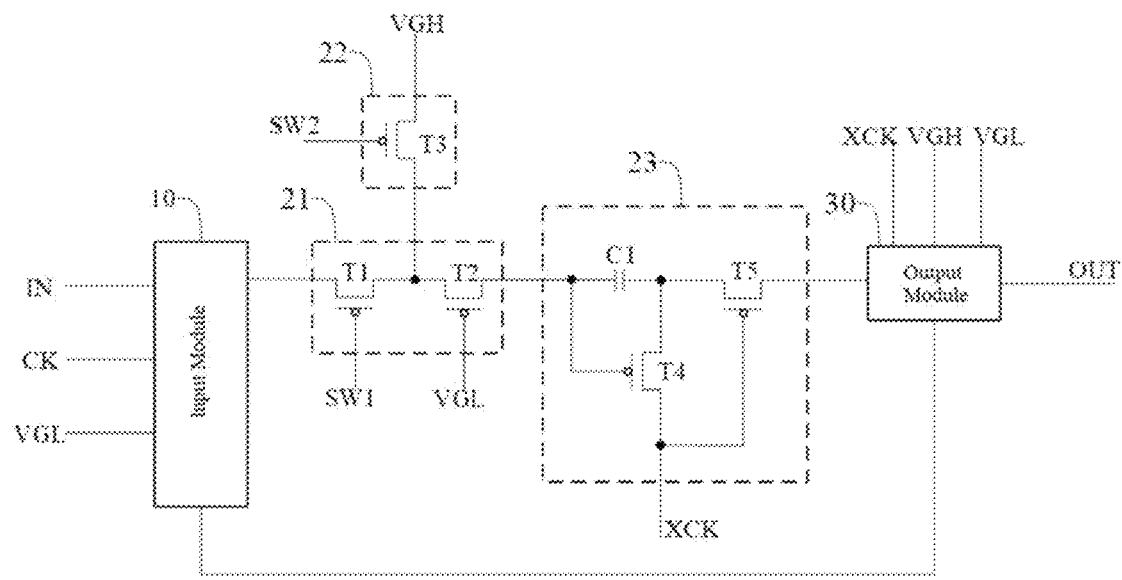
FIG. 7 illustrates a fourth schematic structural diagram of a shift register consistent with the disclosed embodiments of the present disclosure.

FIG. 7 illustrates a fourth schematic structural diagram of a shift register consistent with the disclosed embodiments of the present disclosure. As shown in FIG. 7, the first switch unit 21 also includes a second transistor T2. The control terminal of the second transistor T2 is configured to receive the first power signal VGL. The first terminal of the second transistor T2 is electrically connected to the second terminal of the second switch unit 22 and the second terminal of the first transistor T1 respectively. The second terminal of the second transistor T2 is electrically connected to the first terminal of the energy storage unit 23. Optionally, the second transistor T2 may be a P-type transistor or an N-type transistor, and the type of the second transistor T2 is same as the type of the first transistor T1. As an example, in FIG. 7, each transistor is a P-type transistor. The first power supply signal VGL is a low potential signal, and the second transistor T2 remains in an on state under the control of the first power supply signal VGL. Based on this, the first terminal of the energy storage unit 23 is connected to the second terminal of the first transistor T1 and the second terminal of the second switch unit 22 through the second transistor T2, respectively. As such, the direct impact of the first clock signal CK on the potential of the first terminal of the energy storage unit 23 may be reduced, the potential of the energy storage unit 23 may be stabilized, and the display performance of the display panel may be improved.

Still referring to FIGS. 4, 5 and 7, the second switch unit 22 includes a third transistor T3. The control terminal of the third transistor T3 is configured to receive the second control signal SW2. The first terminal of the third transistor T3 is configured to receive the second clock signal XCK. The second terminal of the third transistor T3 is electrically connected to the second terminal of the first switch unit 21 and the first terminal of the energy storage unit 23 respectively. In the first sub-stage of the holding stage, the third transistor T3 is configured to be turned on under the control of the second control signal SW2. Optionally, in the second sub-stage of the holding stage, the third transistor T3 is configured to be turned off under the control of the second control signal SW2. Based on this, the path through which the first power signal VGL is transmitted to the first terminal of the energy storage unit 23 may be turned on through the third transistor T3, and the first switch unit 21 may be in an off state. In this case, the potential of the first terminal of the energy storage unit 23 may not be affected by the input module 10. As such, the potentials of the first terminal and the third terminal of the energy storage unit 23 may remain consistent. Accordingly, the energy storage unit 23 may not charge or discharge in the first sub-stage, and power consumption may be reduced.

Still referring to FIGS. 2-7, the third transistor T3 may be a P-type transistor or an N-type transistor. For example, the third transistor T3 may be a PMOS, PFET, NMOS or NFET. FIGS. 4 and 7 take the third transistor T3 as a P-type transistor as an example. Referring to the timing sequence shown in FIGS. 2 and 3, for FIGS. 4 and 7, when the second control signal SW2 is in a low potential state, the third transistor T3 is in a conductive state, and when the second control signal SW2 is in a high potential state, the third transistor T3 is in an off state. As an example, FIG. 5 takes the third transistor T3 as an N-type transistor. Referring to the timing sequence shown in FIG. 6, for FIG. 5, when the second control signal SW2 is in a high potential state, the third transistor T3 is in an off state, and when the second control signal SW2 is in a low potential state, the third transistor T3 is in a conductive state.

Still referring to FIGS. 4, 5 and 7, the energy storage unit 23 may include a first capacitor C1, a fourth transistor T4, and a fifth transistor T5. The first terminal of the first capacitor C1 is electrically connected to the second terminal of the first switch unit 21, the second terminal of the second switch unit 22, and the control terminal of the fourth transistor T4, respectively. The second terminal of the first capacitor C1 is electrically connected to the first terminal of the fourth transistor T4 and the first terminal of the fifth transistor T5 respectively. The second terminal of the fourth transistor T4 is connected to the control terminal of the fifth transistor T5. The control terminal of the fifth transistor T5 is configured to receive the second clock signal XCK. The second terminal of the fifth transistor T5 is electrically connected to the control terminal of the output module 30. Optionally, as shown in FIGS. 4 and 7, the fourth transistor T4 and the fifth transistor T5 may be P-type transistors. As shown in FIG. 5, the fourth transistor T4 and the fifth transistor T5 may be N-type transistors.

Figure 8:
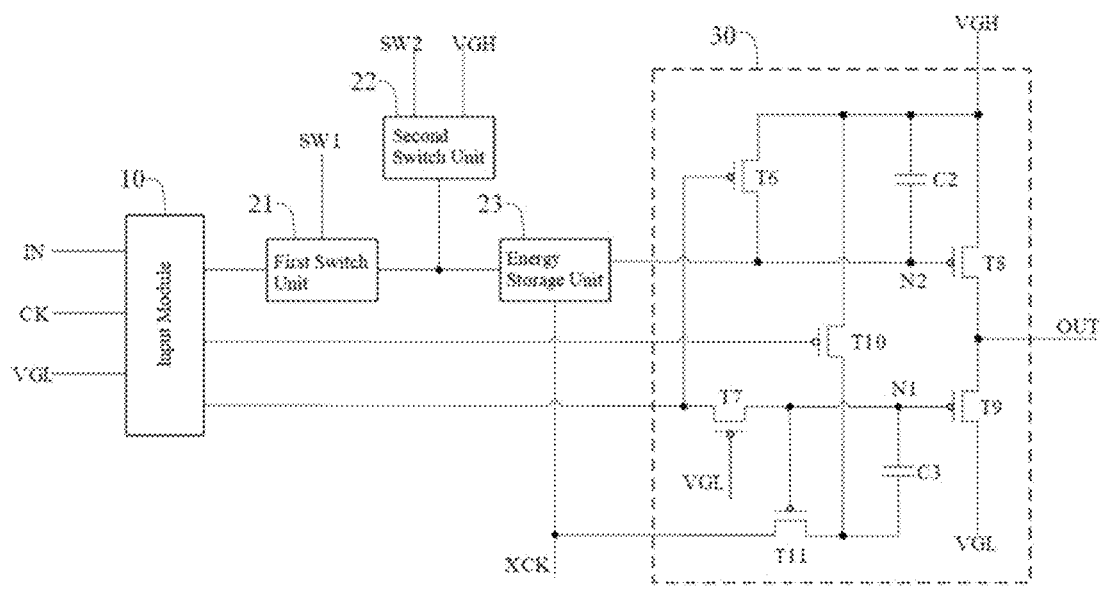
FIG. 8 illustrates a fifth schematic structural diagram of a shift register consistent with the disclosed embodiments of the present disclosure.

FIG. 8 illustrates a fifth schematic structural diagram of a shift register consistent with the disclosed embodiments of the present disclosure. As shown in FIG. 8, the output module 30 may include a sixth transistor T6, a seventh transistor T7, an eighth transistor T8, a ninth transistor T9, and a second capacitor C2. The control terminal of the sixth transistor T6 is electrically connected to the second output terminal of the input module 10 and the first terminal of the seventh transistor T7 respectively. The first terminal of the sixth transistor T6 is electrically connected to the first terminal of the eighth transistor T8 and the first terminal of the second capacitor C2 respectively. The first terminal of the sixth transistor T6 is configured to receive the second power signal VGH. The second terminal of the sixth transistor T6 is electrically connected to the control terminal of the eighth transistor T8, the second terminal of the second capacitor C2, the third terminal of the energy storage unit 23, and the first node N1, respectively. The control terminal of the seventh transistor T7 is configured to receive the first power signal VGL. The second terminal of the seventh transistor T7 is electrically connected to the control terminal of the ninth transistor T9 and the second node N2. The first terminal of the eighth transistor T8 is configured to receive the second power signal VGH. The second terminal of the eighth transistor T8 is electrically connected to the first terminal of the ninth transistor T9. The first terminal of the ninth transistor T9 serves as the output terminal of the output module 30 for outputting the scanning signal OUT. The second terminal of the ninth transistor T9 is configured to receive the second power signal VGH.

Still referring to FIG. 8, the output module 30 may also include a tenth transistor T10, an eleventh transistor T11, and a third capacitor C3. The control terminal of the tenth transistor T10 is electrically connected to the second output terminal of the input module 10. The first terminal of the tenth transistor T10 is configured to receive the second power signal VGH. The second terminal of the tenth transistor T10 is electrically connected to the first terminal of the eleventh transistor T11 and the second terminal of the third capacitor C3 respectively. The control terminal of the eleventh transistor T11 is electrically connected to the second terminal of the seventh transistor T7 and the first terminal of the third capacitor C3 respectively. The second terminal of the eleventh transistor T11 is configured to receive the second clock signal XCK.

Figure 9:
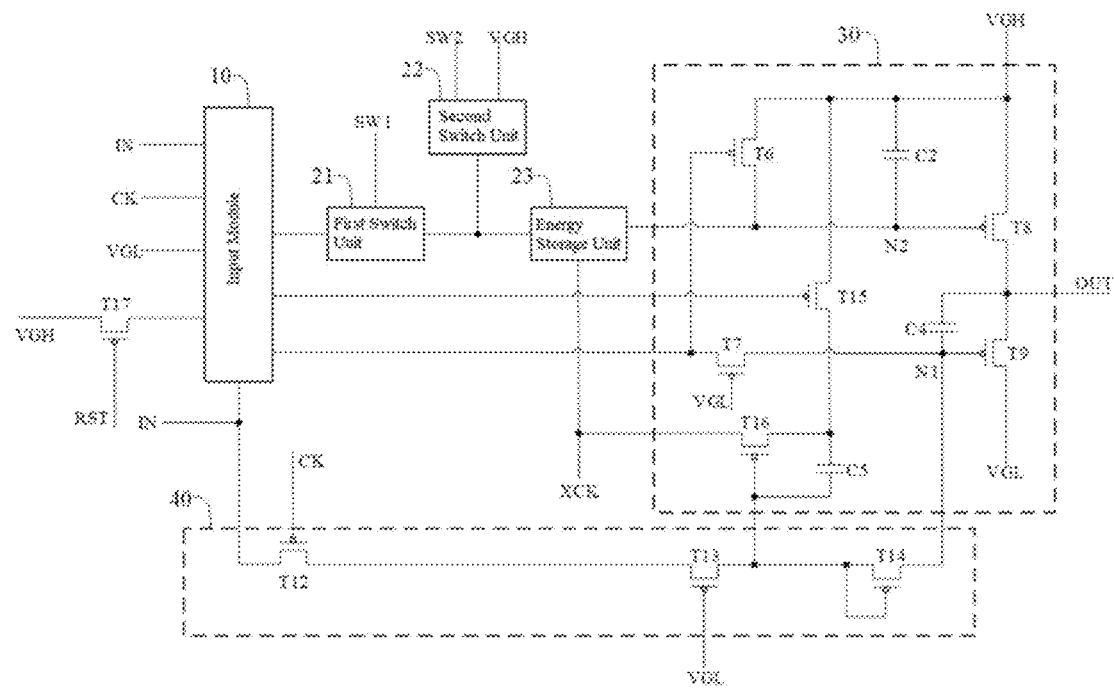
FIG. 9 illustrates a sixth schematic structural diagram of a shift register consistent with the disclosed embodiments of the present disclosure.

FIG. 9 illustrates a sixth schematic structural diagram of a shift register consistent with the disclosed embodiments of the present disclosure. As shown in FIG. 9, the output module 30 may include a sixth transistor T6, a seventh transistor T7, an eighth transistor T8, a ninth transistor T9, a second capacitor C2 and a fourth capacitor C4. The first terminal of the fourth capacitor C4 is electrically connected to the control terminal of the ninth transistor T9. The second terminal of the fourth capacitor C4 is electrically connected to the first terminal of the ninth transistor T9. The fourth capacitor C4 may stabilize the potential of the first node N1. Accordingly, the stability of the scanning signal OUT may be improved, and the display performance of the display panel may be improved.

Still referring to FIG. 9, the output module 30 may also include a fifteenth transistor T15, a sixteenth transistor T16, and a fifth capacitor C5. The control terminal of the fifteenth transistor T15 is electrically connected to the second output terminal of the input module 10. The first terminal of the fifteenth transistor T15 is configured to receive the second power signal VGH. The second terminal of the fifteenth transistor T15 is electrically connected to the second terminal of the sixteenth transistor T16 and the first terminal of the fifth capacitor C5 respectively. The control terminal of the sixteenth transistor T16 is electrically connected to the second terminal of the thirteenth transistor T13 and the second terminal of the fifth capacitor C5 respectively. The first terminal of the sixteenth transistor T16 is configured to receive the second clock signal XCK.

Still referring to FIG. 9, the shift register may also include an adjustment module 40. A plurality of control terminals of the adjustment module 40 is respectively configured to receive the first clock signal CK and the first power signal VGL. The first terminal of the adjustment module 40 is configured to receive the input signal IN. The second terminal of the adjustment module 40 is electrically connected to the control terminal of the ninth transistor T9. The adjustment module 40 is configured to adjust the output module 30 to output the scanning signal OUT during the data writing stage. The scanning signal OUT in the timing sequences shown in FIG. 2, FIG. 3 and FIG. 6 may be an ideal situation. Since the potential of the scanning signal OUT may not complete the transition in an instant, there may be a certain delay in the actual output. Regarding this, in one embodiment, the on-off state of the ninth transistor T9 may be controlled through the adjustment module 40, such that the ninth transistor T9 may quickly respond to output the scanning signal OUT when needed. Accordingly, the problem of delay in signal output may be eased, and display performance may be improved.

Still referring to FIG. 9, the adjustment module 40 may include a twelfth transistor T12, a thirteenth transistor T13, and a fourteenth transistor T14. The control terminal of the twelfth transistor T12 is configured to receive the first clock signal CK. The first terminal of the twelfth transistor T12 is electrically connected to the first terminal of the thirteenth transistor T13. The second terminal of the twelfth transistor T12 is configured to receive the input signal IN. The control terminal of the thirteenth transistor T13 is configured to receive the first power signal VGL. The second terminal of the thirteenth transistor T13 is electrically connected to the control terminal and the first terminal of the fourteenth transistor T14 respectively. The second terminal of the fourteenth transistor T14 is electrically connected to the control terminal of the ninth transistor T9. The twelfth transistor T12, the thirteenth transistor T13, and the fourteenth transistor T14 may be P-type transistors or N-type transistors. Each transistor type of the adjustment module 40 is same as the transistor type of the output module 30. FIG. 9 is only an exemplary illustration, and is not a limitation to the present disclosure.

Still referring to FIG. 9, the shift register may also include a seventeenth transistor T17. The control terminal of the seventeenth transistor T17 is configured to receive the initial signal. The first terminal of the seventeenth transistor T17 is configured to receive the second power signal VGH. The second terminal of the seventeenth transistor T17 is electrically connected to the second output terminal of the input module 10. The initial signal is in a valid potential state at the initial moment of operation of the shift register. The seventh transistor T7 initializes the shift register under the control of the initial signal. The initial signal is in an invalid potential state during the data writing stage and the holding stage of the shift register, and may not affect the normal operation of the shift register.

Figure 10:
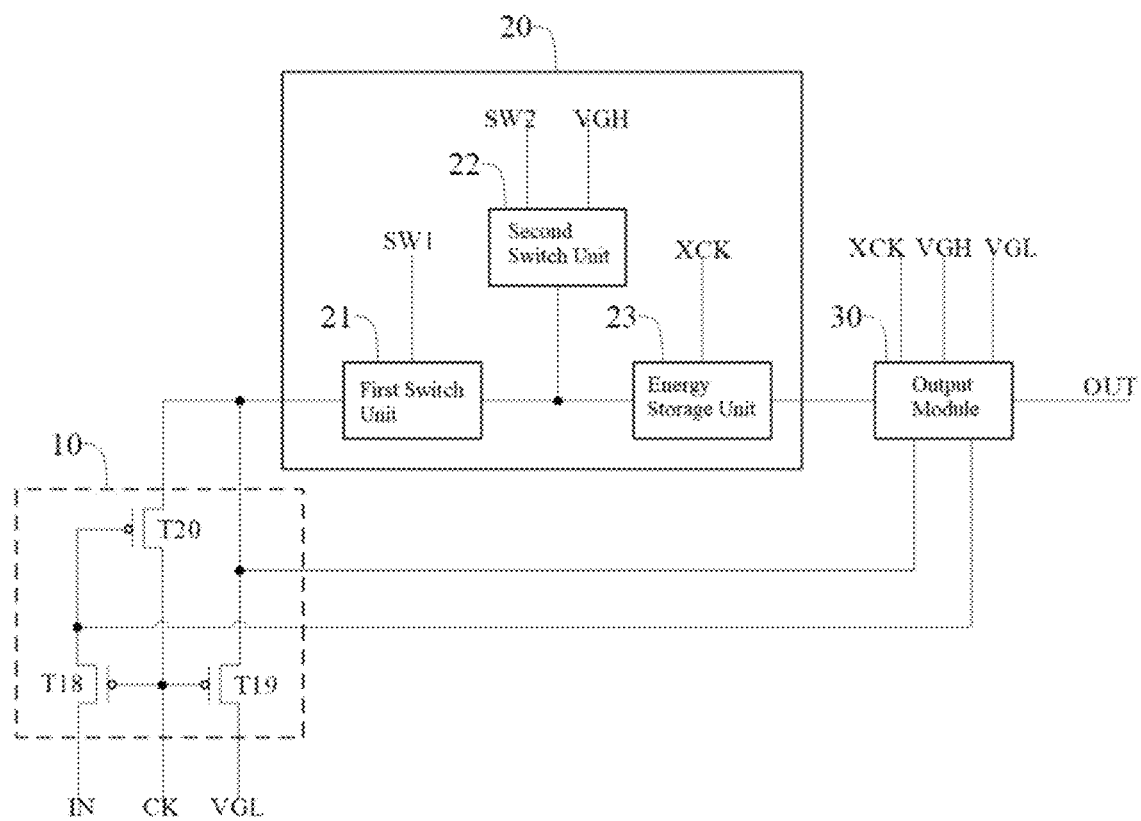
FIG. 10 illustrates a seventh schematic structural diagram of a shift register consistent with the disclosed embodiments of the present disclosure.

FIG. 10 illustrates a seventh schematic structural diagram of a shift register consistent with the disclosed embodiments of the present disclosure. As shown in FIG. 10, the input module 10 may include an eighteenth transistor T18, a nineteenth transistor T19, and a twentieth transistor T20. The control terminal of the eighteenth transistor T18 is electrically connected to the control terminal of the nineteenth transistor T19 and the second terminal of the twentieth transistor T20, respectively. The control terminal of the eighteenth transistor T18 is configured to receive the first clock signal CK. The first terminal of the eighteenth transistor T18 is configured to receive the input signal IN. The second terminal of the eighteenth transistor T18 is electrically connected to the control terminal of the twentieth transistor T20 and the control terminal of the output module 30 respectively. The first terminal of the nineteenth transistor T19 is electrically connected to the first terminal of the twentieth transistor T20, the first terminal of the first switch unit 21, and the other control terminal of the output module 30, respectively. The second terminal of the nineteenth transistor T19 is configured to receive the first power signal VGL. Operationally, the twentieth transistor T20 may be a dual-gate transistor.

FIGS. 11 to 16 are schematic structural diagrams of a plurality of different shift registers provided by the present disclosure. As shown in FIGS. 11 to 16, each shift register includes an input module 10, a control module 20 and an output module 30. The input module 10 includes an eighteenth transistor T18, a nineteenth transistor T19 and a twentieth transistor T20. The control module 20 includes a first switch unit 21, a second switch unit 22 and an energy storage unit 23.

Figure 11:
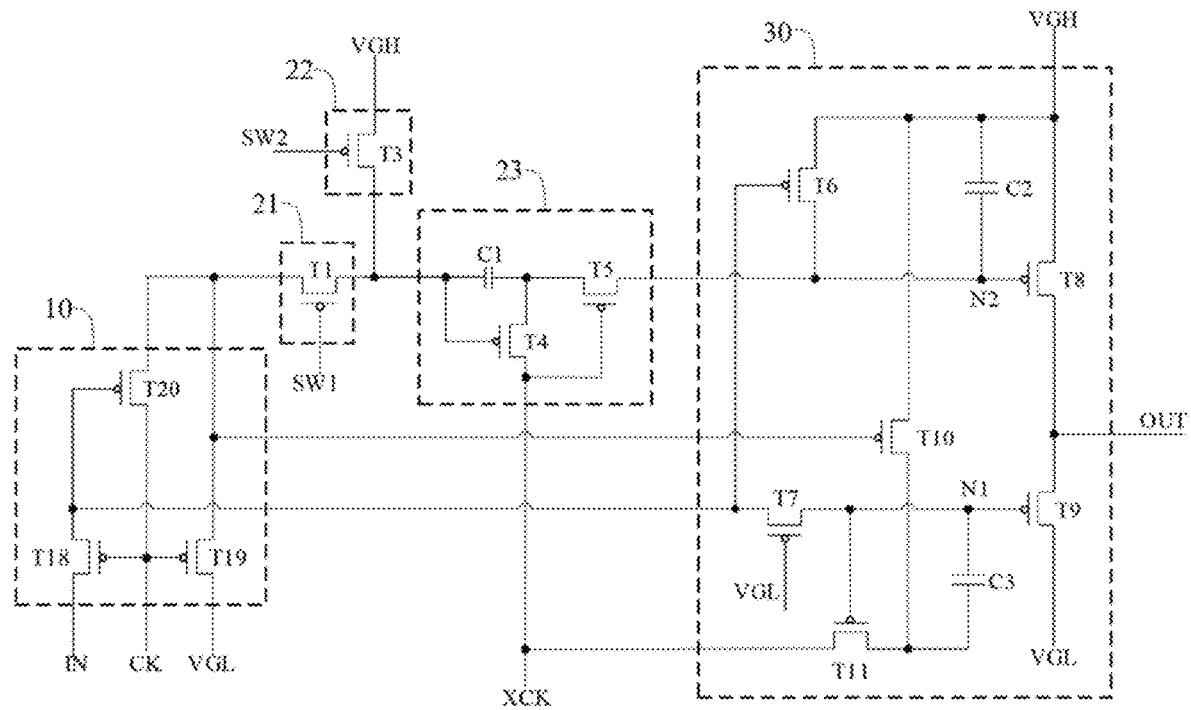
FIG. 11 illustrates an eighth schematic structural diagram of a shift register consistent with the disclosed embodiments of the present disclosure.
Figure 12:
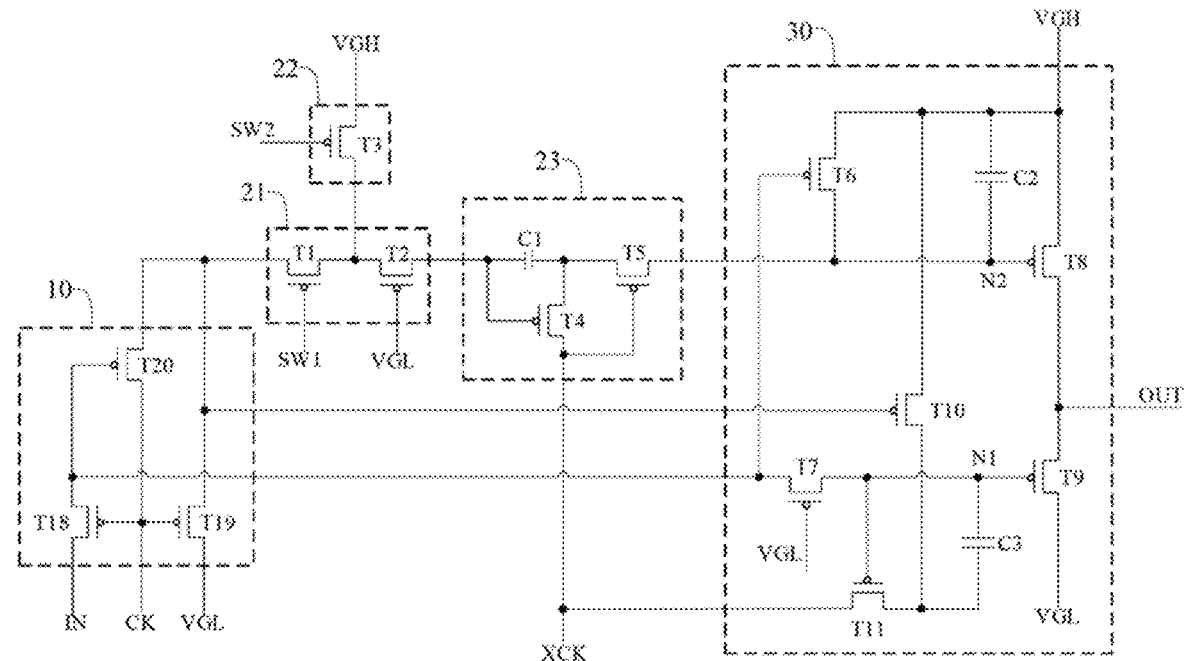
FIG. 12 illustrates a ninth schematic structural diagram of a shift register consistent with the disclosed embodiments of the present disclosure.
Figure 13:
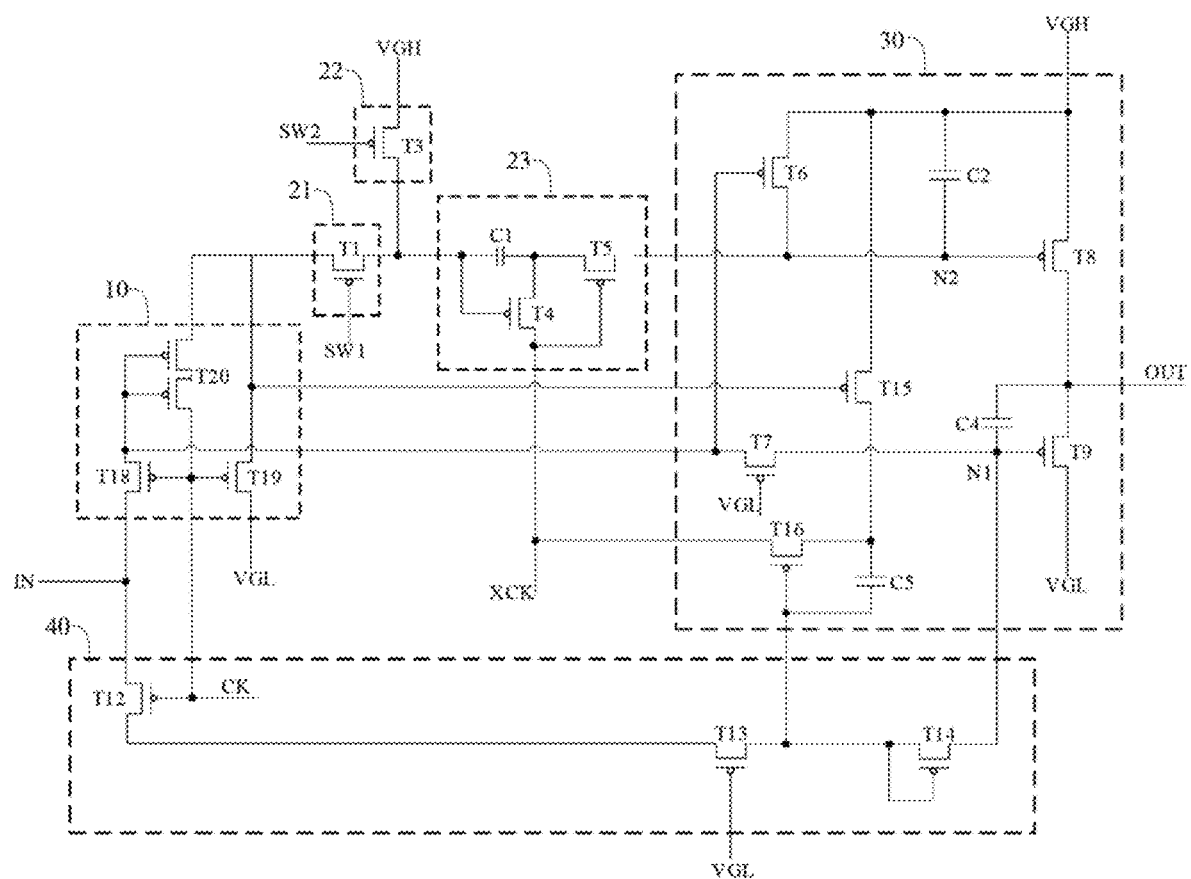
FIG. 13 illustrates a tenth schematic structural diagram of a shift register consistent with the disclosed embodiments of the present disclosure.
Figure 14:
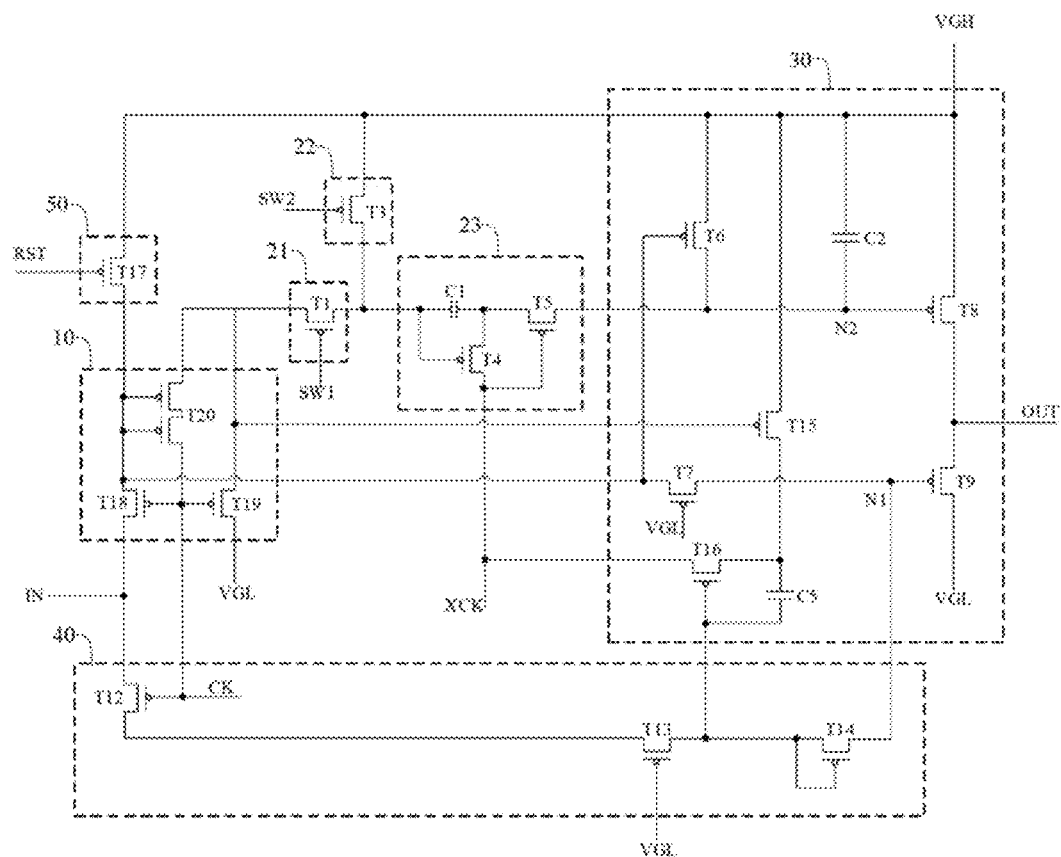
FIG. 14 illustrates an eleventh schematic structural diagram of a shift register consistent with the disclosed embodiments of the present disclosure.

FIG. 11 illustrates an eighth schematic structural diagram of a shift register consistent with the disclosed embodiments of the present disclosure. In FIG. 11, the input module 10 adopts the structure shown in FIG. 10, the control module 20 adopts the structure shown in FIG. 4, and the output module 30 adopts the structure shown in FIG. 8. FIG. 12 illustrates a ninth schematic structural diagram of a shift register consistent with the disclosed embodiments of the present disclosure. Compared with the structure shown in FIG. 11, the twentieth transistor T20 in FIG. 12 is a dual-gate transistor. The first switch unit 21 also includes a second transistor T2. FIG. 13 illustrates a tenth schematic structural diagram of a shift register consistent with the disclosed embodiments of the present disclosure. Compared with the structure shown in FIG. 12, the shift register in FIG. 13 also includes the adjustment module 40 shown in FIG. 9, the first switch unit 21 only includes the first transistor T1, and the output module 30 adopts the structure shown in FIG. 9. FIG. 14 illustrates an eleventh schematic structural diagram of a shift register consistent with the disclosed embodiments of the present disclosure. Compared with the structure shown in FIG. 13, the shift register in FIG. 14 also includes the seventeenth transistor T17 shown in FIG. 9. The output module 30 in FIG. 14 does not include the fourth capacitor C4.

Figure 15:
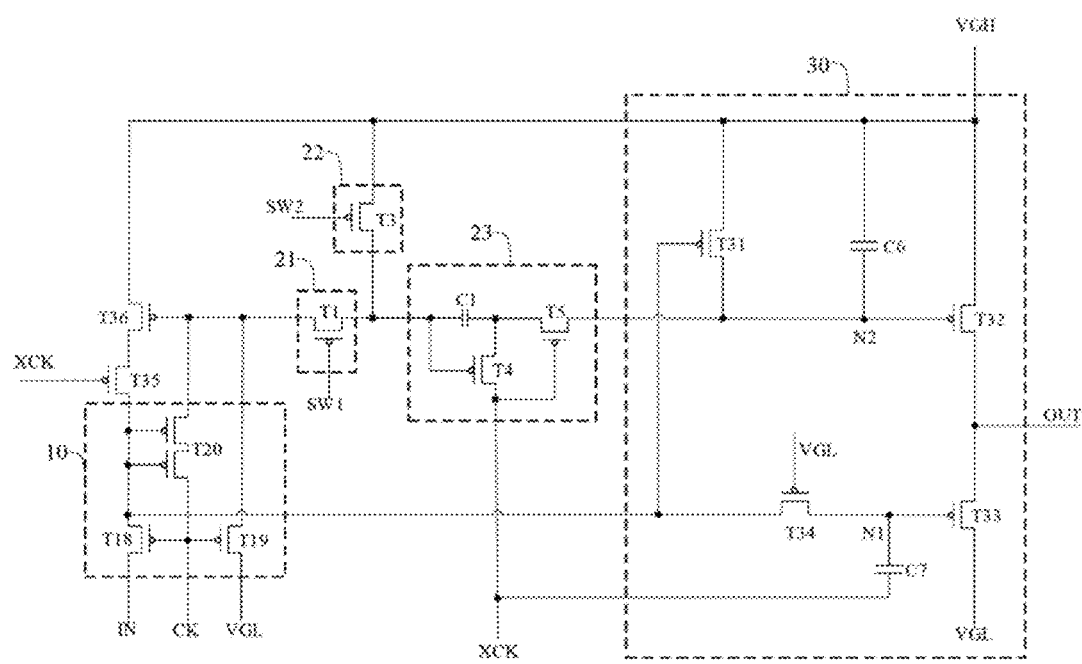
FIG. 15 illustrates a twelfth schematic structural diagram of a shift register consistent with the disclosed embodiments of the present disclosure.

FIG. 15 illustrates a twelfth schematic structural diagram of a shift register consistent with the disclosed embodiments of the present disclosure. Compared with the structure shown in FIG. 12, the twentieth transistor T20 in FIG. 15 is a dual-gate transistor. The output module 30 of FIG. 15 includes transistors T31 to T34, and capacitors C6 and C7. The shift register of FIG. 15 also includes transistors T35 and T36. The control terminal of the transistor T31 is electrically connected to the second terminal of the eighteenth transistor T18, the second terminal of the transistor T34, and the second terminal of the capacitor C7, respectively. The first terminal of the transistor T31 is electrically connected to the first terminal of the capacitor C6, the first terminal of the third transistor T3, the first terminal of the transistor T32, and the second terminal of the transistor T36, respectively. The first terminal of the transistor T31 is configured to receive the second power signal VGH. The second terminal of the transistor T31 is electrically connected to the second terminal of the fifth transistor T5, the control terminal of the transistor T32, and the second terminal of the capacitor C6, respectively. The second terminal of the transistor T32 is electrically connected to the first terminal of the transistor T33. The second terminal of the transistor T32 is configured to output the scanning signal OUT. The control terminal of the transistor T33 is electrically connected to the first terminal of the transistor T34 and the first terminal of the capacitor C7 respectively. The second terminal of the transistor T33 is configured to receive the first power signal VGL. The control terminal of the transistor T34 is configured to receive the first power signal VGL. The control terminal of the transistor T35 is configured to receive the second clock signal XCK. The first terminal of the transistor T35 is electrically connected to the first terminal of the transistor T36. The second terminal of the transistor T35 is electrically connected to the second terminal of the eighteenth transistor T18 and the gate of the twentieth transistor T20, respectively. The control terminal of the transistor T36 is electrically connected to the first terminal of the twentieth transistor T20, the first terminal of the nineteenth transistor T19, and the first terminal of the first transistor T1, respectively.

Figure 16:
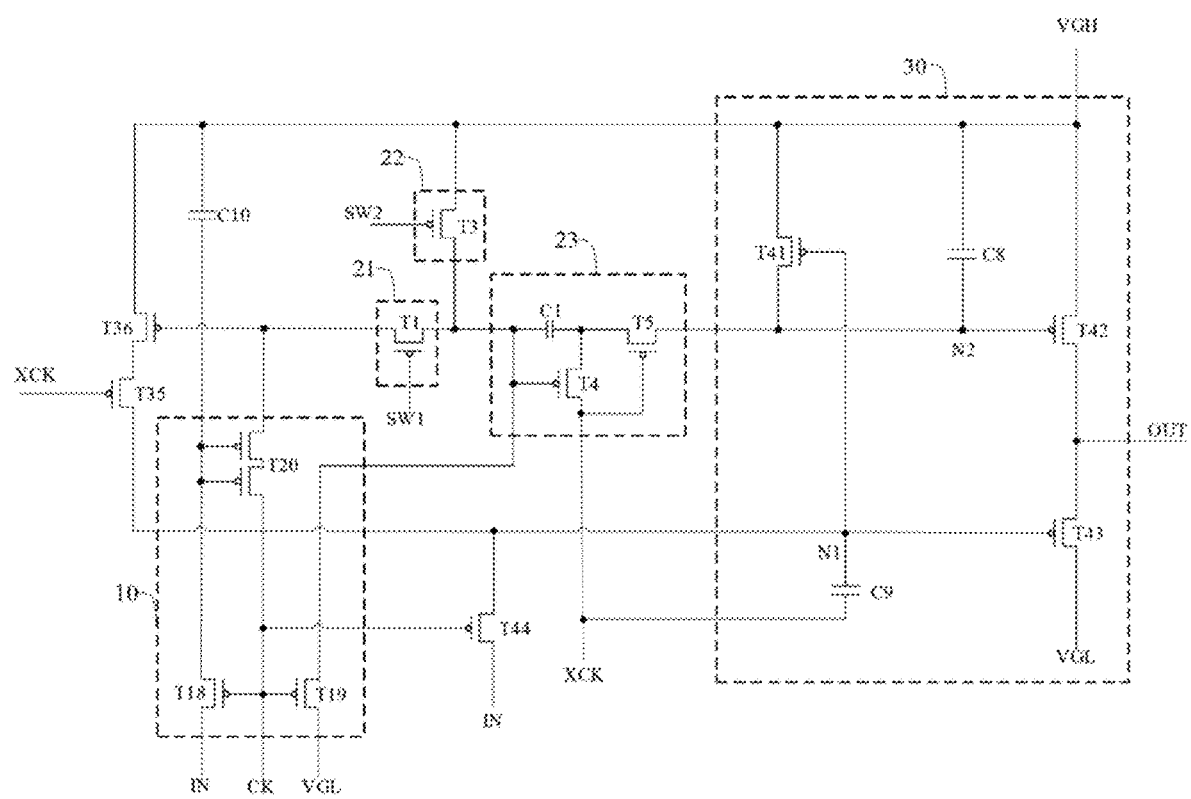
FIG. 16 illustrates a thirteenth schematic structural diagram of a shift register consistent with the disclosed embodiments of the present disclosure.

FIG. 16 illustrates a thirteenth schematic structural diagram of a shift register consistent with the disclosed embodiments of the present disclosure. Compared with the structure shown in FIG. 15, the output module 30 in FIG. 16 includes transistors T41-T43, and capacitors C8 and C9. The shift register of FIG. 16 also includes transistor T44 and capacitor C10. The control terminal of the transistor T41 is electrically connected to the control terminal of the transistor T43, the first terminal of the transistor T44, and the second terminal of the transistor T35, respectively. The first terminal of the transistor T41 is electrically connected to the second terminal of the fifth transistor T5, the control terminal of the transistor T42, and the second terminal of the capacitor C8, respectively. The second terminal of the transistor T41 is electrically connected to the second terminal of the transistor T36, the first terminal of the capacitor C10, the first terminal of the third transistor T3, the first terminal of the capacitor C8, and the first terminal of the transistor T42, respectively. The second terminal of the transistor T41 is configured to receive the second power signal VGH. The second terminal of the transistor T42 is electrically connected to the first terminal of the transistor T43. The second terminal of the transistor T42 is configured to output the scanning signal OUT. The second terminal of the transistor T43 is configured to receive the first power signal VGL. The second terminal of the capacitor C9 is electrically connected to the second terminal of the fourth transistor T4 and the control terminal of the fifth transistor T5 respectively. The second terminal of the capacitor C10 is electrically connected to the control terminal of the twentieth transistor T20 and the second terminal of the eighteenth transistor T18 respectively. The control terminal of the transistor T44 is electrically connected to the second terminal of the twentieth transistor T20. The control terminal of the transistor T44 is configured to receive the first clock signal CK. The second terminal of the transistor T44 is configured to receive the input signal IN. The control terminal of the transistor T35 is configured to receive the second clock signal XCK.

The shift registers shown in FIGS. 11-16 above are explained assuming that each transistor is a P-type transistor. For details of each module and unit, reference may be made to the relevant descriptions of the foregoing embodiments, which will not be elaborated here. It may be understood that for the shift registers shown in FIGS. 11-16, during the holding stage, the first node N1 needs to be maintained in a low potential state, such that the scanning signal OUT may be output stably. Accordingly, the first clock signal CK and the second clock signal XCK need to continuously switch between high and low potentials. In the case where the shift register does not include the first switch unit 21 and the second switch unit 22, the potential of the first terminal of the first capacitor C1 may change due to the change of the first clock signal CK. That is, when the first clock signal CK is in a low potential state, the potential of the first terminal of the first capacitor C1 may also become a low potential. When the first clock signal CK is in a high potential state, the potential of the first terminal of the first capacitor C1 may also change to a high potential. As such, the first capacitor C1 may continue to charge and discharge during the holding stage. To address this issue, the present disclosure adds a first switch unit 21 (first transistor T1, second transistor T2) and a second switch unit 22 (third transistor T3). The on-off state of the first switch unit 21 may be controlled through the first control signal SW1, and the on-off state of the second switch unit 22 may be controlled through the second control signal SW2. As a result, the frequency of charging and discharging of the first capacitor C1 during the holding stage may be reduced, and power consumption may be reduced.

Specifically, referring to the timing sequence shown in FIG. 2, in the data writing stage, the first control signal SW1 may remain in a low potential state. The first transistor T1 may be in an on state under the action of the first control signal SW1. The second control signal SW2 may remain in a high potential state. The third transistor T3 may be in an off state under the action of the second control signal SW2. The shift register may output the scanning signal OUT. In the holding stage, the first control signal SW1 may remain in a high potential state. The first transistor T1 may be in an off state under the action of the first control signal SW1, and the second control signal SW2 may remain in a low potential state. The third transistor T3 may be in a conductive state under the action of the second control signal SW2. The potential at two ends of the first capacitor C1 may remain at a high potential. Accordingly, the first capacitor C1 may not be charged or discharged during the holding stage. As such, power consumption caused by the charging and discharging of the first capacitor C1 may be reduced.

In an example, a circular watch has a resolution of 390*450. Simulations are made for the shift register provided by the present disclosure and the shift register of existing technologies (excluding the first switch unit 21 and the second switch unit 22 described in the present disclosure). Power consumption comparison data of the two shift registers are shown in Table 1 below. In the simulations, VGH=6V, VGL=−6V. According to the simulation results, in the 5 Hz black screen display mode, compared with the existing technology, the present disclosure may save 8% of the power consumption. In a 5 Hz 10% Pixel On 50 nits screen display mode, the present disclosure may save 7% of the power consumption of the Driver IC.

TABLE 1

Comparison Data of Power Consumption

| | | Present Disclosure | | Existing Technology (not including the first switch unit and the second switch unit) | |
| --- | --- | --- | --- | --- | --- |
| | | Minimum value | Maximum Value | Minimum value | Maximum Value |
| Idle mode 2 (5 Hz) 10% Pixel On, 50 nits (Power IC generate OVDD & OVSS) | VDDI0 Current (mA) | 0.42 | 0.50 | 0.42 | 0.50 |
| | VCI Current (mA) | 0.55 | 0.66 | 0.61 | 0.74 |
| | Driver IC Power Consumption (mW) | 2.58 | 3.09 | 2.78 | 3.34 |
| Idle mode 2 (5 Hz) black screen | VDDI0 Current (mA) | 0.42 | 0.50 | 0.42 | 0.50 |
| | VCI Current (mA) | 0.48 | 1.29 | 0.55 | 1.36 |
| | Driver IC Power Consumption (mW) | 2.35 | 5.15 | 2.55 | 5.40 |
| | VDDI0 (V) | 1.80 | | | |
| | VCI (V) | 3.30 | | | |

Figure 17:
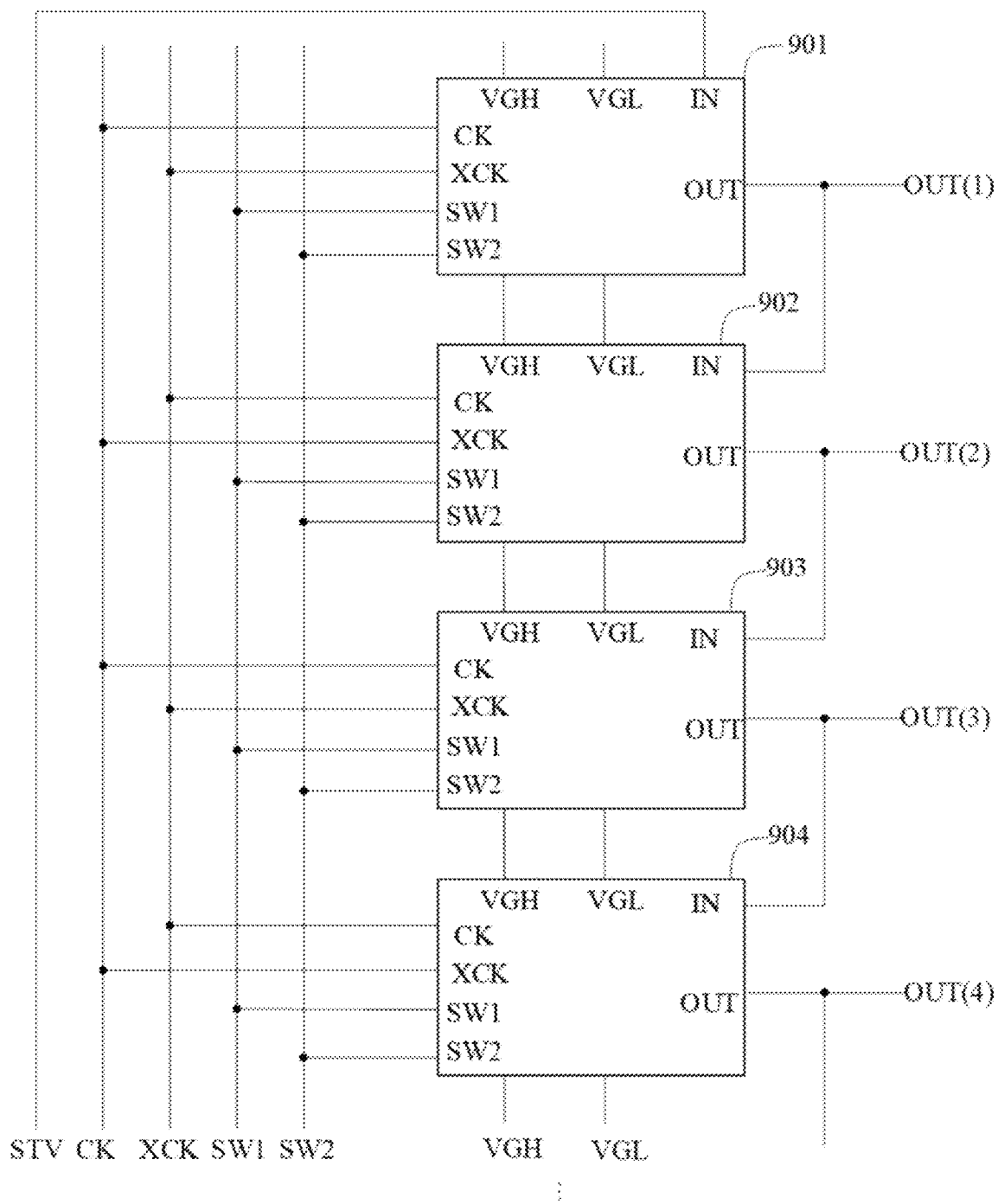
FIG. 17 illustrates a schematic structural diagram of a gate driving circuit consistent with the disclosed embodiments of the present disclosure.

FIG. 17 illustrates a schematic structural diagram of a gate driving circuit consistent with the disclosed embodiments of the present disclosure. As shown in FIG. 17, the gate driving circuit includes a first clock signal line CK, a first clock signal line XCK, a first control signal line SW1, and a second control signal line SW2, and a plurality of cascaded shift registers. FIG. 17 shows four cascaded shift registers 901, 902, 903 and 904.

The input terminal (IN terminal) of the input module 10 in the first-stage shift register is configured to receive the start signal STV. The control terminal (SW1 terminal) of the first switch unit 21 in each shift register is electrically connected to the first control signal line SW1 to receive the first control signal SW1. The control terminal (SW2 terminal) of the second switch unit 22 in each shift register is electrically connected to the second control signal line SW2 to receive the second control signal SW2.

The control terminal and the first input terminal of the input module 10 in the i-th stage shift register (the shift register 901 and the shift register 903 shown in FIG. 17) are respectively electrically connected to the first clock signal line CK to receive the first clock signal CK. The second terminal of the energy storage unit 23 and the first input terminal of the output module 30 in the i-th stage shift register are respectively electrically connected to the second clock signal line XCK to receive the second clock signal XCK, where i is a positive integer greater than 1.

The control terminal and the first input terminal of the input module 10 in the (i+1)-th stage shift register (the shift register 902 and the shift register 904 shown in FIG. 17) are respectively electrically connected to the first clock signal line XCK to receive second clock signal XCK. The second terminal of the energy storage unit 23 in the i-th stage shift register and the first input terminal of the output module 30 in the i-th stage shift register are respectively electrically connected to the first clock signal line CK to receive the first clock signal CK. The input terminal of the input module 10 in the (i+1)-th stage shift register is electrically connected to the output terminal of the output module 30 in the i-th stage shift register.

Each stage of the shift register in the gate driving circuit shown in FIG. 17 may be connected to a corresponding potential of pixel circuit to provide the scanning signal OUT to the pixel circuit, driving the light-emitting element to emit light. The display function may thus be realized. Based on the gate driving circuit provided by the present disclosure, the energy storage unit in each stage of the shift register may be controlled not to charge or discharge during the holding stage, and power consumption may thus be reduced.

In one embodiment, a driving method of a gate driving circuit is provided. The driving method may be applied to the gate driving circuit provided in the present disclosure. The driving method includes a data writing stage and a holding stage. In a first sub-stage of the holding stage, the first switch unit 21 that controls the gate driving circuit is turned off, and the second switch unit 22 that controls the gate driving circuit is turned on. As such, the potential states of the first terminal of the energy storage unit 23 and the third terminal of the energy storage unit 23 may be kept consistent. Based on this, in the first sub-stage, by controlling the first switch unit 21 to be turned off and the second switch unit 22 to be turned on, the potentials of the first terminal and the third terminal of the energy storage unit 23 may be kept consistent. Accordingly, the energy storage unit 23 may not be charged or discharged, and the power consumption of the energy storage unit 23 due to charging and discharging may be avoided.

Optionally, in the data writing stage and the second sub-stage of the holding stage, the first switch unit 21 is controlled to be turned on, and the second switch unit 22 is controlled to be turned off. As such, under the control of the second clock signal XCK, the energy storage unit 23 may be charged and discharged according to the control signal output by the first output terminal of the input module 10 and the second power signal VGH. Based on this, in the second sub-stage, by controlling the first switch unit 21 to be turned on and the second switch unit 22 to be turned off, the shift register at each stage in the gate driving circuit may be restored to the state of the data writing stage, to prepare for the next drive. Accordingly, display performance may be improved.

In one embodiment, a display panel is provided. The display panel includes the gate driving circuit provided by the present disclosure. The display panel provided by the present disclosure is suitable for display devices with display functions, such as mobile phones, tablet computers, and wearable devices such as smart watches. For example, a smart watch may have a lower refresh frequency and a longer retention stage. Based on the shift register provided by the present disclosure, the energy storage unit 23 may not be charged or discharged during the retention phase. As such, power consumption caused by charging and discharging may be avoided, and the power consumption of the display panel may be reduced. It should be noted that the display panel provided by the present disclosure may be suitable for low temperature poly-silicon (LTPS) products and low temperature polysilicon oxide (LTPO) products.

Figure 18:
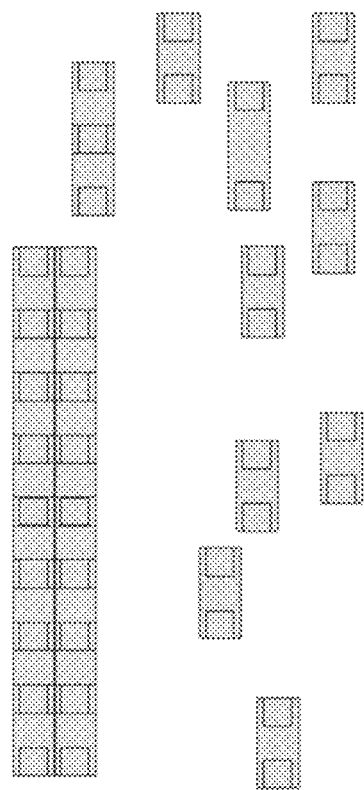
FIG. 18 illustrates a schematic structural diagram of a first metal layer consistent with the disclosed embodiments of the present disclosure.
Figure 19:
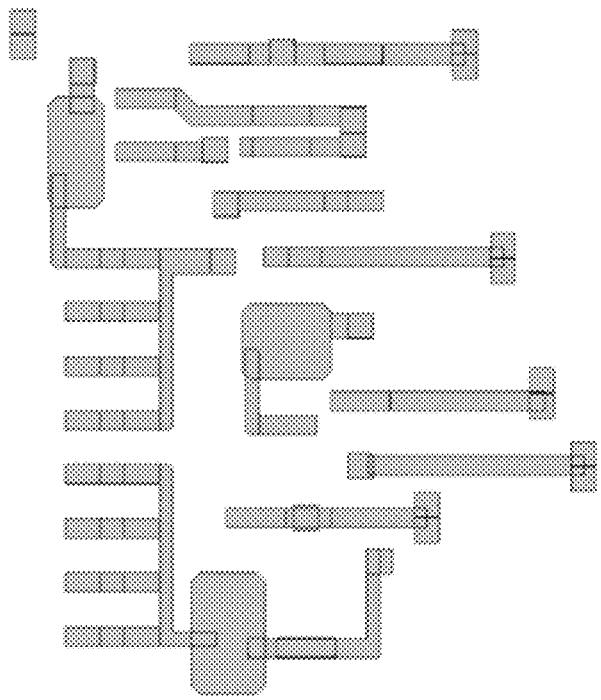
FIG. 19 illustrates a schematic structural diagram of a second metal layer consistent with the disclosed embodiments of the present disclosure.
Figure 20:
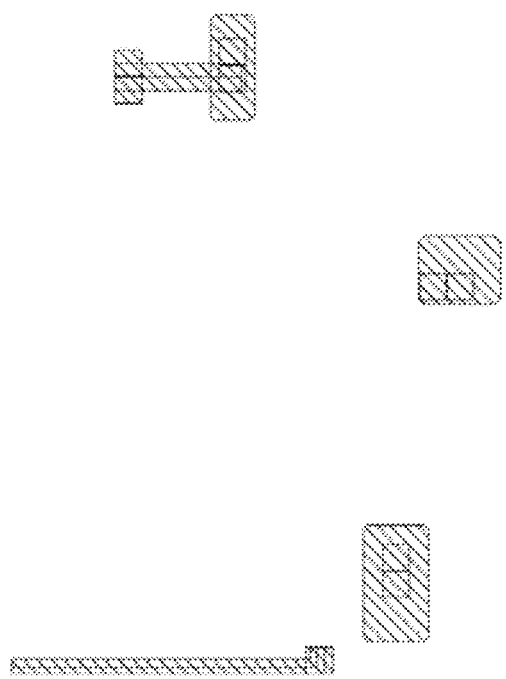
FIG. 20 illustrates a schematic structural diagram of a third metal layer consistent with the disclosed embodiments of the present disclosure.
Figure 21:
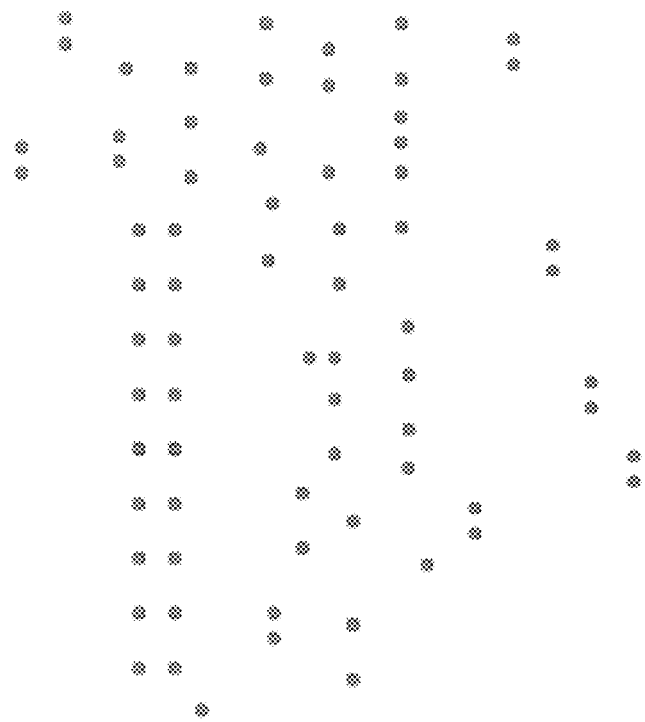
FIG. 21 illustrates a schematic structural diagram of contact holes consistent with the disclosed embodiments of the present disclosure.
Figure 22:
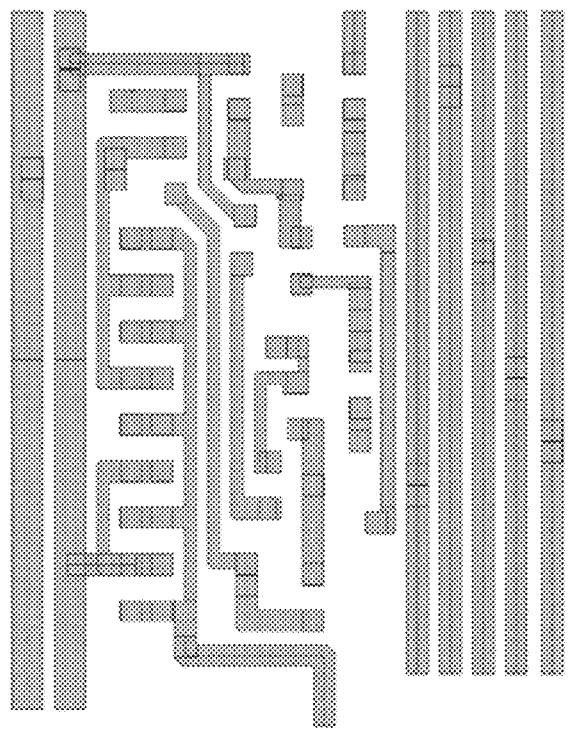
FIG. 22 illustrates a schematic structural diagram of a fourth metal layer consistent with the disclosed embodiments of the present disclosure.
Figure 23:
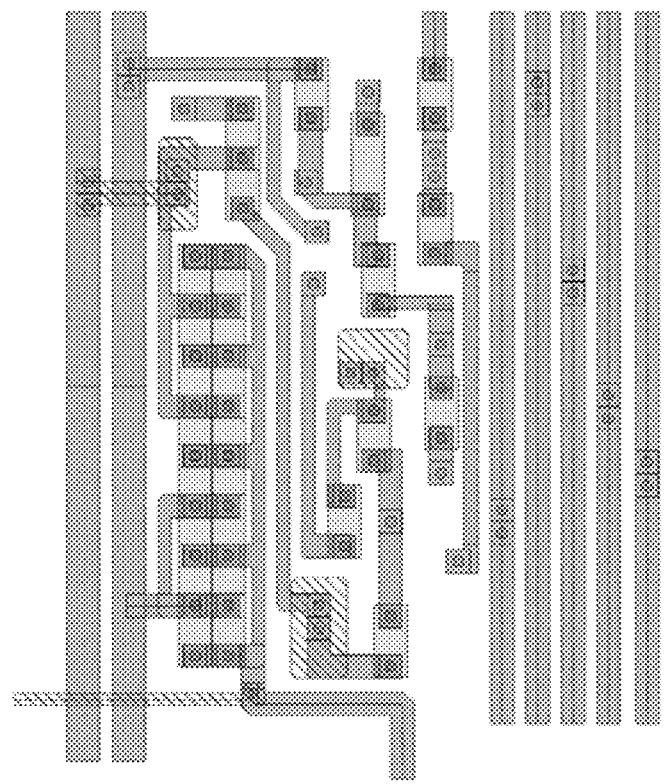
FIG. 23 illustrates a schematic structural diagram of a structure formed by sequentially stacking a third metal layer, contact holes, and a fourth metal layer from bottom to top, consistent with the disclosed embodiments of the present disclosure.
Figure 24:
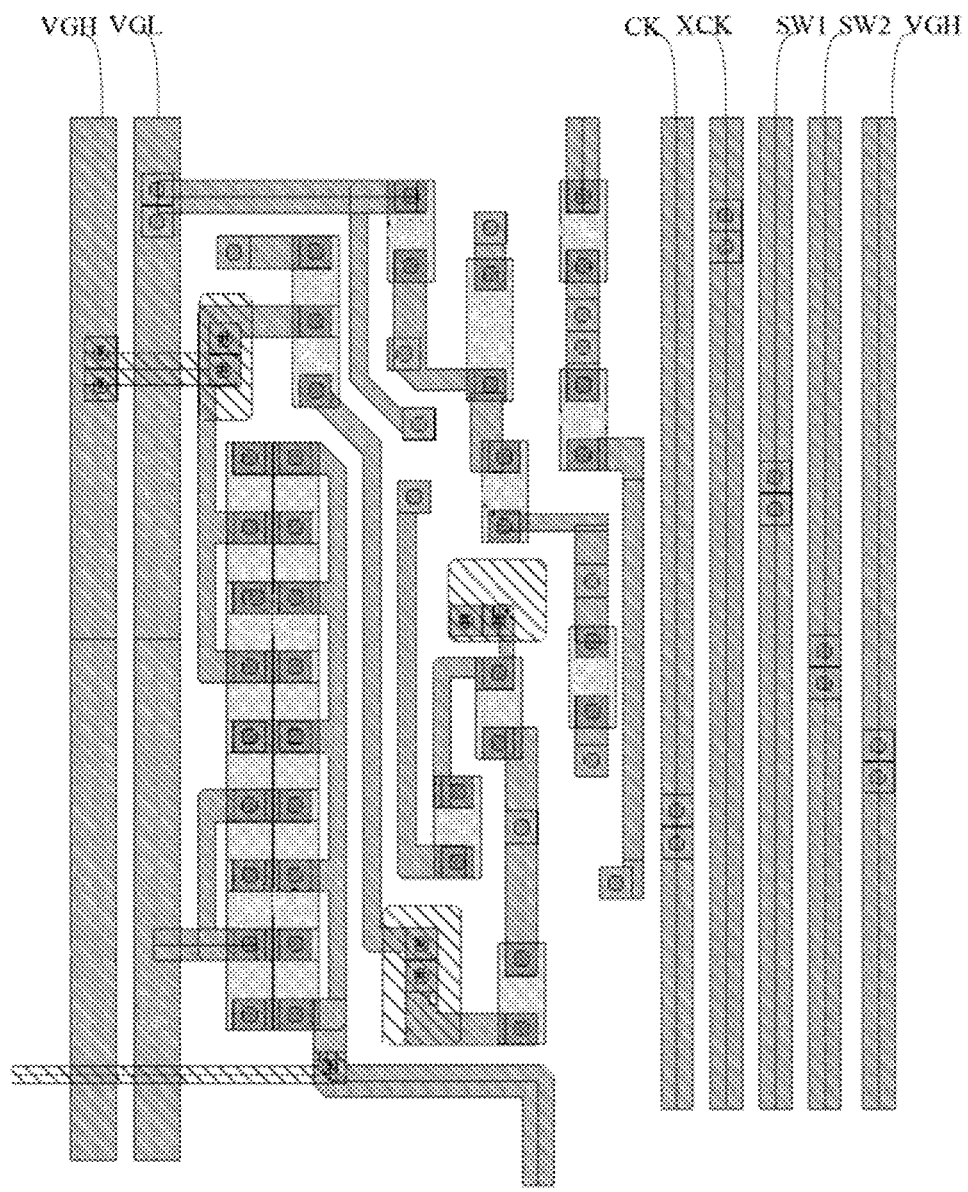
FIG. 24 illustrates a schematic planar-layout structural diagram of a display panel consistent with the disclosed embodiments of the present disclosure.

FIG. 18 illustrates a schematic structural diagram of a first metal layer consistent with the disclosed embodiments of the present disclosure. FIG. 19 illustrates a schematic structural diagram of a second metal layer consistent with the disclosed embodiments of the present disclosure. FIG. 20 illustrates a schematic structural diagram of a third metal layer consistent with the disclosed embodiments of the present disclosure. FIG. 21 illustrates a schematic structural diagram of contact holes consistent with the disclosed embodiments of the present disclosure. FIG. 22 illustrates a schematic structural diagram of a fourth metal layer consistent with the disclosed embodiments of the present disclosure. FIG. 23 illustrates a schematic structural diagram of a structure formed by sequentially stacking a third metal layer, contact holes, and a fourth metal layer from bottom to top, consistent with the disclosed embodiments of the present disclosure. FIG. 24 illustrates a schematic planar-layout structural diagram of a display panel consistent with the disclosed embodiments of the present disclosure. FIG. 24 may also be taken as a schematic structural diagram formed by superimposing FIGS. 18 to 22 from bottom to top.

As shown in FIGS. 18-24, the display panel includes a substrate, and a first metal layer, a second metal layer (M1), a third metal layer (MC) and a fourth metal layer that are sequentially away from the substrate. In the shift register of the gate driving circuit, the first transistor T1 in the first switch unit 21 includes a first oxide active layer and a first gate, and the third transistor T3 in the second switch unit 22 includes a second oxide active layer and second gate. The first oxide active layer includes the first terminal and the second terminal of the first transistor T1, and the second oxide active layer includes the first terminal and the second terminal of the second transistor T2. The first oxide active layer and the second oxide active layer are respectively located on the first metal layer. The first gate and the second gate are respectively located on the second metal layer. The first terminal of the first capacitor C1 in the energy storage unit 23 is located on the second metal layer, and the second terminal of the first capacitor C1 of the energy storage unit 23 is located on the third metal layer. The first clock signal line CK, the second clock signal line XCK, the first control signal line SW1 and the second control signal line SW2 are respectively located on the fourth metal layer. Contact holes may be used to realize electrical connections between various structures. For example, the first gate of the first transistor T1 may be electrically connected to the first control signal line SW1 through the contact hole, and the first gate of the second transistor T2 may be electrically connected to the second control signal line SW2 through the contact hole. For details of other electrical connection structures, reference may be made to relevant descriptions of the shift registers provided by the present disclosure.

In the shift registers provided by the present disclosure, the first metal layer, the second metal layer, the third metal layer, and the fourth metal layer may be multiplexed. As such, no additional film layers are added, and the film layer design may be simplified. Accordingly, in the first sub-stage of the holding stage, potentials at two terminals of the first capacitor C1 of the energy storage unit 23 in the shift register may be kept consistent, and the power consumption of the display panel may thus be reduced. For example, when the base frame of the display panel is 60 Hz, and the display frequency is 1 Hz, there is no charging or discharging during 59 Hz. As a result, power consumption of the display panel may be reduced, and a narrow-frame structure may be realized.

As disclosed, the technical solutions of the present disclosure have the following advantages.

The present disclosure provides a shift register, a gate driving circuit and a driving method, and a display panel. The shift register includes an input module, a control module and an output module. The control module includes a first switch unit, a second switch unit and an energy storage unit. The control terminal of the first switch unit is configured to receive the first control signal. The first terminal of the first switch unit is electrically connected to the first output terminal of the input module. The second terminal of the first switch unit is electrically connected to the first terminal of the energy storage unit and the second terminal of the second switch unit respectively. The control terminal of the second switch unit is configured to receive the second control signal. The first terminal of the second switch unit is configured to receive the second power signal. The second terminal of the energy storage unit is configured to receive the second clock signal. In the first sub-stage of the holding stage, the first switch unit may be turned off under the control of the first control signal, and the second switch unit may be turned on under the control of the second control signal. As such, potential states of the first terminal of the energy storage unit and the third terminal of the energy storage unit may be kept consistent. Accordingly, in the first sub-stage of the holding stage, the energy storage unit may not be charged or discharged, and power consumption caused by charging and discharging may thus be avoided. For a display panel with a long holding stage, by setting the time of the first sub-stage, the power consumption of the display panel may be reduced, and the display performance of the display panel may be improved.

The embodiments disclosed herein are exemplary only and not limiting the scope of the present disclosure. Various combinations, alternations, modifications, equivalents, or improvements to the technical solutions of the disclosed embodiments may be obvious to those skilled in the art. Without departing from the spirit and scope of this disclosure, such combinations, alternations, modifications, equivalents, or improvements to the disclosed embodiments are encompassed within the scope of the present disclosure.

What is claimed is:

1. A shift register, comprising:
    an input module, wherein a control terminal of the input module is configured to receive a first clock signal, and a plurality of input terminals of the input module is configured to receive an input signal, the first clock signal, and a first power signal respectively;
    a control module, including a first switch unit, a second switch unit, and an energy storage unit, wherein a control terminal of the first switch unit is configured to receive a first control signal, a first terminal of the first switch unit is electrically connected to a first output terminal of the input module, a second terminal of the first switch unit is electrically connected to a first terminal of the energy storage unit and a second terminal of the second switch unit respectively, a control terminal of the second switch unit is configured to receive a second control signal, a first terminal of the second switch unit is configured to receive a second power signal, and a second terminal of the energy storage unit is configured to receive a second clock signal; and
    an output module, wherein a plurality of control terminals of the output module is electrically connected to the first power signal, the first output terminal of the input module, a second output terminal of the input module, and a third terminal of the energy storage unit respectively, a plurality of input terminals of the output module is respectively configured to receive the second clock signal, the first power signal and the second power signal, and a output terminal of the output module is configured to output a scanning signal,
    wherein:
        in a first sub-stage of a holding stage, the first switch unit is configured to be turned off under control of the first control signal, and the second switch unit is configured to be turned on under control of the second control signal, to keep potential states of the first terminal of the energy storage unit and the third terminal of the energy storage unit consistent.

2. The shift register according to claim 1, wherein:
    in a second sub-stage of the holding stage, the first switch unit is configured to be turned on under control of the first control signal, and the second switch unit is configured to be turned off under control of the second control signal, such that, under control of the second clock signal, the energy storage unit is charged and discharged according to a control signal output by the first output terminal of the input module and the second power signal.

3. The shift register according to claim 2, wherein:
    a duration of the second sub-stage is greater than or equal to a period in which the first clock signal has an active potential; or
    the first sub-stage precedes the second sub-stage.

4. The shift register according to claim 1, wherein:
    in a data writing stage, the first switch unit is configured to be turned on under control of the first control signal, and the second switch unit is configured to be turned off under control of the second control signal, such that, under control of the second clock signal, the energy storage unit is charged and discharged according to a control signal output by the first output terminal of the input module and the second power signal.

5. The shift register according to claim 1, wherein:
    the first switch unit includes a first transistor, wherein a control terminal of the first transistor is configured to receive the first control signal, a first terminal of the first transistor is connected to the first output terminal of the input module, a second terminal of the first transistor is electrically connected to the first terminal of the energy storage unit and the second terminal of the second switch unit respectively; and
    in the first sub-stage of the holding stage, the first transistor is configured to be turned off under control of the first control signal.

6. The shift register according to claim 5, wherein:
the first transistor is a P-type transistor or an N-type transistor; or
the first switch unit further includes a second transistor, wherein a control terminal of the second transistor is configured to receive the first power signal, a first terminal of the second transistor is electrically connected to the second terminal of the second switch unit and the second terminal of the first transistor respectively, and a second terminal of the second transistor is electrically connected to the first terminal of the energy storage unit.

7. The shift register according to claim 1, wherein:
the second switch unit includes a third transistor, wherein a control terminal of the third transistor is configured to receive the second control signal, a first terminal of the third transistor is configured to receive the second clock signal, a second terminal of the third transistor is electrically connected to the second terminal of the first switch unit and the first terminal of the energy storage unit respectively;
in the first sub-stage of the holding stage, the third transistor is configured to be turned on under control of the second control signal; and
the third transistor is a P-type transistor or an N-type transistor.

8. The shift register according to claim 1, wherein the energy storage unit include a first capacitor, a fourth transistor, and a fifth transistor, wherein:
a first terminal of the first capacitor is electrically connected to the second terminal of the first switch unit, the second terminal of the second switch unit, and a control terminal of the fourth transistor respectively;
a second terminal of the first capacitor is electrically connected to a first terminal of the fourth transistor and a first terminal of the fifth transistor respectively;
a second terminal of the fourth transistor is connected to a control terminal of the fifth transistor; and
a control terminal of the fifth transistor is configured to receive the second clock signal, and a second terminal of the fifth transistor is electrically connected to a control terminal of the output module.

9. The shift register according to claim 1, wherein the output module includes a sixth transistor, a seventh transistor, an eighth transistor, a ninth transistor, and a second capacitor, wherein:
a control terminal of the sixth transistor is electrically connected to the second output terminal of the input module and a first terminal of the seventh transistor respectively;
a first terminal of the sixth transistor is electrically connected to a first terminal of the eighth transistor and a first terminal of the second capacitor respectively, and the first terminal of the sixth transistor is configured to receive the second power signal;
a second terminal of the sixth transistor is electrically connected to a control terminal of the eighth transistor, a second terminal of the second capacitor, and the third terminal of the energy storage unit respectively;
a control terminal of the seventh transistor is configured to receive the first power signal, and a second terminal of the seventh transistor is electrically connected to a control terminal of the ninth transistor;
a first terminal of the eighth transistor is configured to receive the second power signal, a second terminal of the eighth transistor is electrically connected to a first terminal of the ninth transistor; and the first terminal of the ninth transistor serves as the output terminal of the output module for outputting the scanning signal, and a second terminal of the ninth transistor is configured to receive the second power signal.

10. The shift register according to claim 9, wherein the output module further includes a tenth transistor, an eleventh transistor, and a third capacitor, wherein:
a control terminal of the tenth transistor is electrically connected to the second output terminal of the input module, a first terminal of the tenth transistor is configured to receive the second power signal, and a second terminal of the tenth transistor is electrically connected to a first terminal of the eleventh transistor and a second terminal of the third capacitor respectively; and
a control terminal of the eleventh transistor is electrically connected to the second terminal of the seventh transistor and a first terminal of the third capacitor respectively, and a second terminal of the eleventh transistor is configured to receive the second clock signal.

11. The shift register according to claim 9, wherein the output module further includes a fourth capacitor, wherein:
a first terminal of the fourth capacitor is electrically connected to the control terminal of the ninth transistor, and a second terminal of the fourth capacitor is electrically connected to the first terminal of the ninth transistor.

12. The shift register according to claim 9, further comprising an adjustment module, wherein:
a plurality of control terminals of the adjustment module is respectively configured to receive the first clock signal and the first power signal;
a first terminal of the adjustment module is configured to receive the input signal, and a second terminal of the adjustment module is electrically connected to the control terminal of the ninth transistor; and
the adjustment module is configured to adjust the output module to output the scanning signal during a data writing stage.

13. The shift register according to claim 12, wherein the adjustment module includes a twelfth transistor, a thirteenth transistor, and a fourteenth transistor, wherein:
a control terminal of the twelfth transistor is configured to receive the first clock signal, a first terminal of the twelfth transistor is electrically connected to a first terminal of the thirteenth transistor, a second terminal of the twelfth transistor is configured to receive the input signal; and
a control terminal of the thirteenth transistor is configured to receive the first power signal, a second terminal of the thirteenth transistor is electrically connected to a control terminal of the fourteenth transistor T14 and a first terminal of the fourteenth transistor T14 respectively, and a second terminal of the fourteenth transistor is electrically connected to the control terminal of the ninth transistor.

14. The shift register according to claim 13, wherein the output module further includes a fifteenth transistor, a sixteenth transistor, and a fifth capacitor, wherein:
a control terminal of the fifteenth transistor is electrically connected to the second output terminal of the input module, a first terminal of the fifteenth transistor is configured to receive the second power signal, and a second terminal of the fifteenth transistor is electrically connected to a second terminal of the sixteenth transistor and a first terminal of the fifth capacitor respectively; and a control terminal of the sixteenth transistor is electrically connected to the second terminal of the thirteenth transistor and a second terminal of the fifth capacitor respectively, and a first terminal of the sixteenth transistor is configured to receive the second clock signal.

15. The shift register according to claim 1, further comprising a seventeenth transistor, wherein:

a control terminal of the seventeenth transistor is configured to receive an initial signal, a first terminal of the seventeenth transistor is configured to receive the second power signal, and a second terminal of the seventeenth transistor is electrically connected to the second output terminal of the input module.

16. A gate driving circuit, comprising a first clock signal line, a second clock signal line, a first control signal line, a second control signal line, and a plurality of cascaded shift registers, wherein:

the plurality of cascaded shift registers includes a first stage shift register, an i-th stage shift register, and an (i+1)-th stage shift register, wherein i is a positive integer greater than 1;

a shift register of the plurality of cascaded shift registers includes an input module, wherein a control terminal of the input module is configured to receive a first clock signal, and a plurality of input terminals of the input module is configured to receive an input signal, the first clock signal, and a first power signal respectively; a control module, including a first switch unit, a second switch unit, and an energy storage unit, wherein a control terminal of the first switch unit is configured to receive a first control signal, a first terminal of the first switch unit is electrically connected to a first output terminal of the input module, a second terminal of the first switch unit is electrically connected to a first terminal of the energy storage unit and a second terminal of the second switch unit respectively, a control terminal of the second switch unit is configured to receive a second control signal, a first terminal of the second switch unit is configured to receive a second power signal, and a second terminal of the energy storage unit is configured to receive a second clock signal; and an output module, wherein a plurality of control terminals of the output module is electrically connected to the first power signal, the first output terminal of the input module, a second output terminal of the input module, and a third terminal of the energy storage unit respectively, a plurality of input terminals of the output module is respectively configured to receive the second clock signal, the first power signal and the second power signal, and a output terminal of the output module is configured to output a scanning signal;

an input terminal of the input module in the first-stage shift register is configured to receive a start signal, a control terminal of the first switch unit in each shift register is electrically connected to the first control signal line to receive the first control signal, a control terminal of the second switch unit in each shift register is electrically connected to the second control signal line to receive the second control signal;

a control terminal of the input module in the i-th stage shift register and a first input terminal of the input module in the i-th stage shift register are respectively electrically connected to the first clock signal line to receive the first clock signal, a second terminal of the energy storage unit and a first input terminal of the output module in the i-th stage shift register are respectively electrically connected to the second clock signal line to receive the second clock signal; and a control terminal of the input module in the (i+1)-th stage shift register and a first input terminal of the input module in the (i+1)-th stage shift register are respectively electrically connected to the second clock signal line to receive second clock signal, a second terminal of the energy storage unit in the i-th stage shift register and the first input terminal of the output module in the i-th stage shift register are respectively electrically connected to the first clock signal line to receive the first clock signal, and an input terminal of the input module in the (i+1)-th stage shift register is electrically connected to an output terminal of the output module in the i-th stage shift register.

17. A driving method for the gate driving circuit according to claim 16, comprising a data writing stage and a holding stage, wherein:

in a first sub-stage of the holding stage, the first switch unit that controls the gate driving circuit is turned off, and the second switch unit that controls the gate driving circuit is turned on, such that potential states of the first terminal of the energy storage unit and the third terminal of the energy storage unit are kept consistent.

18. The driving method according to claim 17, wherein:

in the data writing stage and a second sub-stage of the holding stage, the first switch unit is controlled to be turned on, and the second switch unit is controlled to be turned off, such that, under control of the second clock signal, the energy storage unit is charged and discharged according to the control signal output by the first output terminal of the input module and the second power signal.

19. A display panel comprising a gate driving circuit, wherein the gate driving circuit includes a first clock signal line, a second clock signal line, a first control signal line, a second control signal line, and a plurality of cascaded shift registers, wherein:

the plurality of cascaded shift registers includes a first stage shift register, an i-th stage shift register, and an (i+1)-th stage shift register, wherein i is a positive integer greater than 1;

a shift register of the plurality of cascaded shift registers includes an input module, wherein a control terminal of the input module is configured to receive a first clock signal, and a plurality of input terminals of the input module is configured to receive an input signal, the first clock signal, and a first power signal respectively; a control module, including a first switch unit, a second switch unit, and an energy storage unit, wherein a control terminal of the first switch unit is configured to receive a first control signal, a first terminal of the first switch unit is electrically connected to a first output terminal of the input module, a second terminal of the first switch unit is electrically connected to a first terminal of the energy storage unit and a second terminal of the second switch unit respectively, a control terminal of the second switch unit is configured to receive a second control signal, a first terminal of the second switch unit is configured to receive a second power signal, and a second terminal of the energy storage unit is configured to receive a second clock signal; and an output module, wherein a plurality of control terminals of the output module is electrically connected to the first power signal, the first output terminal of the input module, a second output terminal of the input module, and a third terminal of the energy storage unit respectively, a plurality of input terminals of the output module is respectively configured to receive the second clock signal, the first power signal and the second power signal, and a output terminal of the output module is configured to output a scanning signal;

an input terminal of the input module in the first-stage shift register is configured to receive a start signal, a control terminal of the first switch unit in each shift register is electrically connected to the first control signal line to receive the first control signal, a control terminal of the second switch unit in each shift register is electrically connected to the second control signal line to receive the second control signal;

a control terminal of the input module in the i-th stage shift register and a first input terminal of the input module in the i-th stage shift register are respectively electrically connected to the first clock signal line to receive the first clock signal, a second terminal of the energy storage unit and a first input terminal of the output module in the i-th stage shift register are respectively electrically connected to the second clock signal line to receive the second clock signal; and a control terminal of the input module in the (i+1)-th stage shift register and a first input terminal of the input module in the (i+1)-th stage shift register are respectively electrically connected to the second clock signal line to receive second clock signal, a second terminal of the energy storage unit in the i-th stage shift register and the first input terminal of the output module in the i-th stage shift register are respectively electrically connected to the first clock signal line to receive the first clock signal, and an input terminal of the input module in the (i+1)-th stage shift register is electrically connected to an output terminal of the output module in the i-th stage shift register.

20. The display panel according to claim 19, further comprising a substrate, and a first metal layer, a second metal layer, a third metal layer and a fourth metal layer that are sequentially away from the substrate, wherein:

in the shift register of the gate driving circuit, the first transistor in the first switch unit includes a first oxide active layer and a first gate, and the third transistor in the second switch unit includes a second oxide active layer and second gate;

the first oxide active layer and the second oxide active layer are respectively located on the first metal layer, the first gate and the second gate are respectively located on the second metal layer, the first terminal of the first capacitor in the energy storage unit is located on the second metal layer, and the second terminal of the first capacitor of the energy storage unit is located on the third metal layer; and the first clock signal line, the second clock signal line, the first control signal line and the second control signal line are respectively located on the fourth metal layer.

* * * * *